(12) United States Patent
Kim et al.

(10) Patent No.: US 11,257,530 B2
(45) Date of Patent: Feb. 22, 2022

(54) MEMORY CONTROLLER AND METHOD OF OPERATING THE SAME

(71) Applicant: SK hynix Inc., Icheon (KR)

(72) Inventors: Hyun Sub Kim, Seongnam (KR); Ie Ryung Park, Suwon (KR); Dong Sop Lee, Yongin (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/730,826

(22) Filed: Dec. 30, 2019

(65) Prior Publication Data
US 2021/0151085 A1 May 20, 2021

(30) Foreign Application Priority Data

Nov. 19, 2019 (KR) ........................ 10-2019-0149055

(51) Int. Cl.
| | |
|---|---|
| *G11C 7/22* | (2006.01) |
| *G06F 1/08* | (2006.01) |
| *G06F 1/12* | (2006.01) |
| *G06F 13/16* | (2006.01) |
| *G11C 7/10* | (2006.01) |

(52) U.S. Cl.
CPC ............. *G11C 7/222* (2013.01); *G06F 1/08* (2013.01); *G06F 1/12* (2013.01); *G06F 13/1689* (2013.01); *G11C 7/1051* (2013.01)

(58) Field of Classification Search
CPC ....... G11C 7/222; G11C 7/225; G11C 7/1051; G11C 11/4076; G11C 29/023; G11C 16/32; G11C 7/227; G06F 1/08; G06F 1/12; G06F 1/324; G06F 1/10; G06F 13/1689
See application file for complete search history.

(56) References Cited

U.S. PATENT DOCUMENTS

| | | | |
|---|---|---|---|
| 6,233,250 B1 | 5/2001 | Liu et al. | |
| 6,466,736 B1 | 10/2002 | Chen et al. | |
| 6,529,571 B1 | 3/2003 | Gaudet | |
| 6,587,918 B1 * | 7/2003 | Christenson | ........ G06F 13/1636 |
| | | | 711/106 |
| 7,054,195 B2 | 5/2006 | Matsunaga | |

(Continued)

FOREIGN PATENT DOCUMENTS

| | | |
|---|---|---|
| KR | 100875348 B1 | 12/2008 |
| KR | 100940611 B1 | 2/2010 |

(Continued)

OTHER PUBLICATIONS

Office Action dated Jul. 28, 2021 in U.S. Appl. No. 16/841,030.

(Continued)

*Primary Examiner* — Ajay Ojha

(57) ABSTRACT

A memory controller may control a memory device. The memory device may be coupled to the memory controller through a channel. The memory controller may include an idle time monitor and a clock signal generator. The idle time monitor may output an idle time interval of the memory device. The idle time interval may be between an end time of a previous operation of the memory device and a start time of a current operation. The clock signal generator may generate a clock signal based on the idle time interval and output the clock signal to the memory device through the channel to perform a current operation.

20 Claims, 28 Drawing Sheets

(56) References Cited

U.S. PATENT DOCUMENTS

| | | |
|---|---|---|
| 7,315,957 B1 | 1/2008 | Wagner et al. |
| 7,464,282 B1 | 12/2008 | Abdollahi-Alibeik et al. |
| 7,827,424 B2 | 11/2010 | Bounitch |
| 9,142,001 B2 | 9/2015 | Samson et al. |
| 9,405,350 B2 | 8/2016 | Kanai et al. |
| 9,424,901 B1 | 8/2016 | An et al. |
| 9,633,737 B2 | 4/2017 | An |
| 10,042,416 B2 * | 8/2018 | Tzafrir .................. G06F 1/3225 |
| 10,249,234 B2 | 4/2019 | Kim |
| 10,409,357 B1 * | 9/2019 | Li ....................... G11C 11/4093 |
| 10,825,535 B1 | 11/2020 | Pawlowski |
| 11,056,176 B2 | 7/2021 | Shin |
| 2005/0201192 A1 | 9/2005 | Honda |
| 2007/0217356 A1 | 9/2007 | Kanno et al. |
| 2009/0002868 A1 | 1/2009 | Van Den Bremt et al. |
| 2009/0244756 A1 | 10/2009 | Itakura et al. |
| 2009/0285061 A1 | 11/2009 | Nagai |
| 2014/0023169 A1 | 1/2014 | Valiani et al. |
| 2016/0062930 A1 | 3/2016 | Kijima et al. |
| 2017/0062065 A1 | 3/2017 | Shim et al. |
| 2017/0351316 A1 | 12/2017 | Vratonjic et al. |
| 2018/0165023 A1 | 6/2018 | Oh et al. |
| 2019/0050159 A1 | 2/2019 | Jung et al. |
| 2019/0354300 A1 * | 11/2019 | Benisty .................. G11C 7/222 |
| 2020/0159435 A1 | 5/2020 | Walker et al. |

FOREIGN PATENT DOCUMENTS

| | | |
|---|---|---|
| KR | 1020110004165 A | 1/2011 |
| KR | 101620348 B1 | 5/2016 |
| KR | 20180138351 A | 12/2018 |
| KR | 101983463 B1 | 5/2019 |

OTHER PUBLICATIONS

Office Action dated Oct. 27, 2021 in related U.S. Appl. No. 16/868,116.

Office Action dated Oct. 14, 2021 in related U.S. Appl. No. 16/888,444.

Office Action dated Dec. 3, 2021 in U.S. Appl. No. 16/888,492.

* cited by examiner

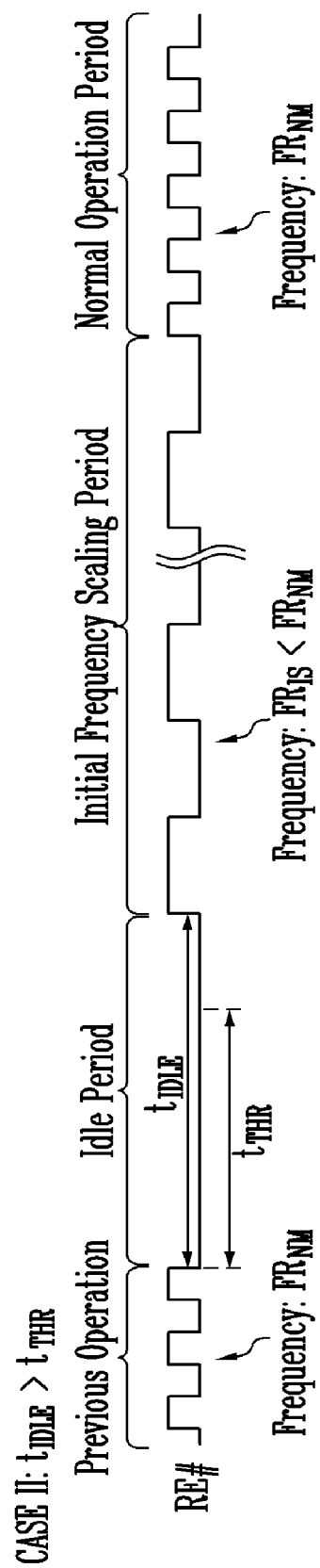

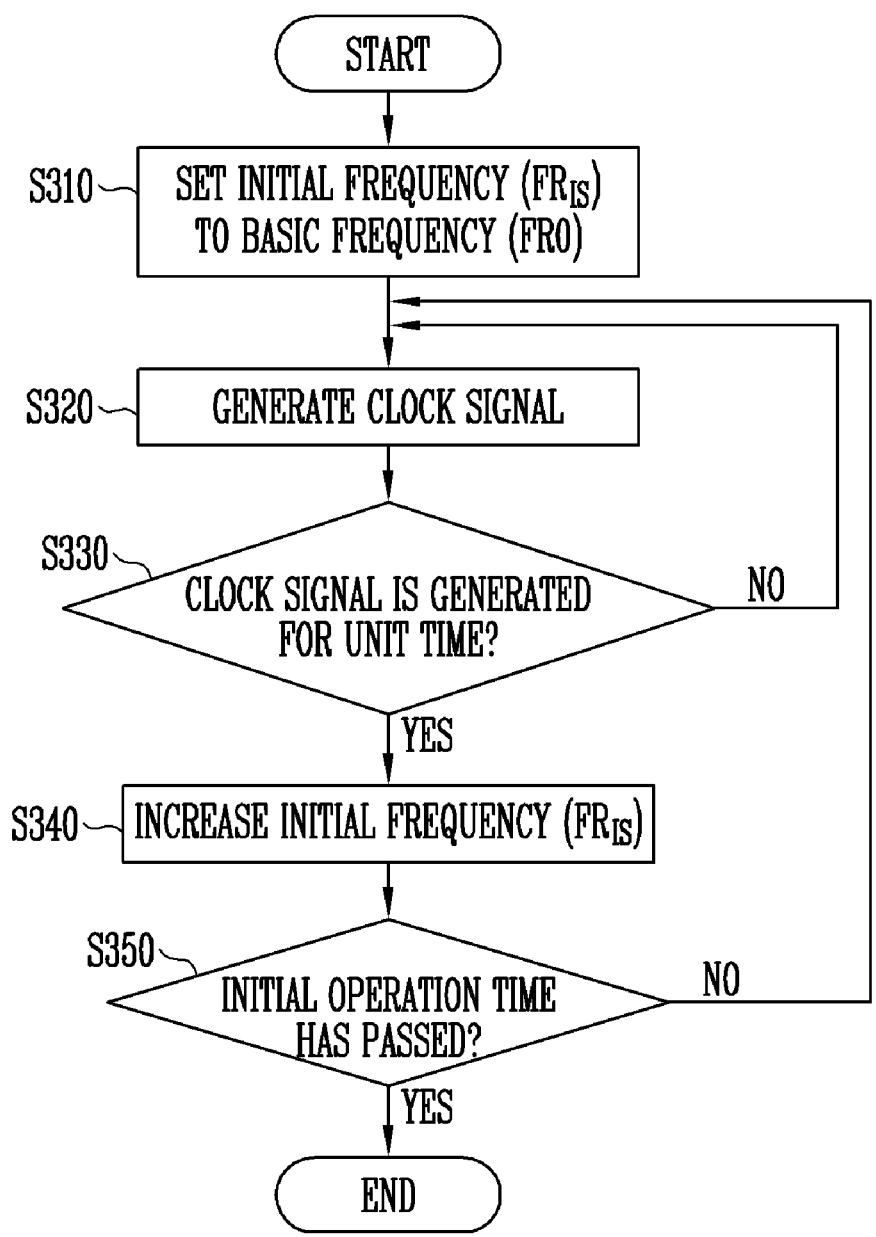

MEMORY CONTROLLER AND METHOD OF OPERATING THE SAME

CROSS-REFERENCE TO RELATED APPLICATION

The present application claims priority under 35 U.S.C. § 119(a) to Korean Patent Application Number 10-2019-0149055, filed on Nov. 19, 2019, in the Korean Intellectual Property Office, the entire disclosure of which is incorporated herein by reference.

BACKGROUND

1. Technical Field

Various embodiments of the present disclosure generally relate to an electronic device, and more particularly, to a memory controller and a method of operating the memory controller.

2. Related Art

Generally, a storage device is a device which stores data under control of a host device such as a computer, a smartphone, or a smartpad. According to the type of device provided to store data, examples of the storage device may be classified into a device such as a hard disk drive (HDD) which stores data in a magnetic disk, and a device such as a solid state drive (SSD) or a memory card which stores data in a semiconductor memory, particularly, a nonvolatile memory.

The storage device may include a memory device in which data is stored, and a memory controller configured to store data in the memory device. Memory devices may be classified into volatile memories and nonvolatile memories. Representative examples of the nonvolatile memories may include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc.

SUMMARY

Various embodiments of the present disclosure are directed to a memory controller capable of sequentially increasing or reducing the total current that is consumed in a plurality of memory devices, and a method of operating the memory controller.

An embodiment of the present disclosure may provide for a memory controller configured to control a memory device. The memory device may be coupled to the memory controller through a channel. The memory controller includes: an idle time monitor configured to output an idle time interval of the memory device, the idle time interval being between an end time of a previous operation of the memory device and a start time of a current operation; and a clock signal generator configured to generate a clock signal based on the idle time interval and output the clock signal to the memory device through the channel to perform the current operation.

In an embodiment, the clock signal generator may include: a frequency controller configured to determine a frequency for generating the clock signal based on the idle time interval; and a signal generator configured to generate the clock signal based on the determined frequency.

In an embodiment, when the idle time interval is greater than a threshold time interval, the frequency controller may determine an initial frequency for generating the clock signal during an initial frequency scaling period, and a normal frequency for generating the clock signal during a normal operation period. During the initial frequency scaling period, the signal generator may generate the clock signal based on the initial frequency. During the normal operation period after the initial frequency scaling period, the signal generator may generate the clock signal based on the normal frequency.

In an embodiment, a value of the initial frequency may be less than a value of the normal frequency.

In an embodiment, the frequency controller gradually increases the initial frequency during the initial frequency scaling period.

In an embodiment, the initial frequency may have a constant value during the initial frequency scaling period.

In an embodiment, when the idle time interval is equal to or less than a threshold time interval, the frequency controller may determine a normal frequency, and the signal generator may generate the clock signal based on the normal frequency.

In an embodiment, the signal generator may generate a read enable signal as the clock signal.

In an embodiment, the signal generator may generate a data strobe signal as the clock signal.

In an embodiment, the initial frequency scaling period may include a first initial frequency scaling period and a second initial frequency scaling period. The frequency controller may determine a first initial frequency for generating the clock signal during the first initial frequency scaling period and a second initial frequency for generating the clock signal during the second initial frequency scaling period. During the first initial frequency scaling period, the signal generator may generate the clock signal based on the first initial frequency, the first initial frequency being less than the normal frequency. During the second initial frequency scaling period, the signal generator may generate the clock signal based on the second initial frequency, the second initial frequency being less than the normal frequency and greater than the first initial frequency.

In an embodiment, the first initial frequency may have a constant value during the first initial frequency scaling period. The second initial frequency may gradually increase during the second initial frequency scaling period.

An embodiment of the present disclosure may provide for a storage device including: a plurality of memory devices; and a memory controller coupled with the plurality of memory devices through a plurality of channels and configured to control the plurality of memory devices. When a single memory device among the plurality of memory devices starts an operation, the memory controller may generate a clock signal based on an idle time interval of the memory device and output the clock signal to the memory device.

In an embodiment, when the idle time interval is greater than a threshold time interval, the memory controller may generate the clock signal based on a first frequency during an initial operation period, and generate the clock signal based on a second frequency greater than the first frequency during a normal operation period after the initial operation period.

In an embodiment, the first frequency may be maintained at a constant value during the initial operation frequency.

In an embodiment, the first frequency may increase during the initial operation frequency.

In an embodiment, the clock signal may be any one of a read enable signal and a data strobe signal.

An embodiment of the present disclosure may provide for a method of operating a memory controller, including: determining to start an operation of a memory device that is idle; determining an idle time interval of the memory device; and generating a clock signal based on the idle time interval to output the clock signal to the memory device during the operation of the memory device.

In an embodiment, generating the clock signal based on the idle time interval may include: determining whether the idle time interval is greater than a threshold time interval; generating the clock signal based on an initial frequency when the idle time interval is greater the threshold time interval; and generating the clock signal based on a normal frequency, the normal frequency being greater than the initial frequency.

In an embodiment, generating the clock signal based on the initial frequency may include generating the clock signal based on the initial frequency having a constant value.

In an embodiment, generating the clock signal based on the initial frequency may include generating the clock signal based on the initial frequency having a value that gradually increases.

In an embodiment, generating the clock signal based on the initial frequency may further include: setting initial frequency to a basic frequency; generating a clock signal based on the initial frequency until a number of cycles of the first clock signal reaches a given number; increasing the initial frequency; and generating a second clock signal based on the increased initial frequency until a number of cycles of the second clock signal reaches the given number.

In an embodiment, generating the clock signal based on the initial frequency may include: setting the initial frequency to a basic frequency; generating the clock signal during a unit time interval, based on the initial frequency; increasing the initial frequency; and generating the clock signal during the unit time interval, based on the increased initial frequency.

An embodiment of the present disclosure may provide for a storage device including: a plurality of memory devices; and a memory controller coupled with the plurality of memory devices through a plurality of channels, respectively, and configured to control the plurality of memory devices. When a selected memory device among the plurality of memory devices starts an operation, the memory controller may generate a clock signal based on an idle time interval of at least one unselected memory device among the plurality of memory devices and outputs the generated clock signal to the selected memory device.

In an embodiment, the at least one unselected memory device is a single unselected memory device and the idle time interval is that of the single unselected memory device. When the idle time interval is greater than a threshold time interval, the memory controller may generate the clock signal based on a first frequency during an initial operation period, and generate the clock signal based on a second frequency during a normal operation period after the initial operation period, the second frequency being greater than the first frequency.

In an embodiment, the at least one unselected memory device is two or more unselected memory devices and the idle time interval is a sum of idle time intervals of the two or more unselected memory devices. When the idle time interval is greater than a threshold time interval, the memory controller may generate the clock signal based on a first frequency during an initial operation period, and generate the clock signal based on a second frequency during a normal operation period after the initial operation period, the second frequency being greater than the first frequency.

An embodiment of the present disclosure may provide for a storage device including: a plurality of memory devices; and a memory controller coupled with the plurality of memory devices through a channel and configured to control the plurality of memory devices. When a selected memory device among the plurality of memory devices starts an operation, the memory controller may generate a clock signal based on an idle time interval of at least one unselected memory device among the plurality of memory devices and outputs the generated clock signal to the selected memory device.

In an embodiment, the at least one unselected memory device is a single unselected memory device and the idle time interval is that of the single unselected memory device. When the idle time interval is greater than a threshold time interval, the memory controller may generate the clock signal based on a first frequency during an initial operation period, and generate the clock signal based on a second frequency during a normal operation period after the initial operation period, the second frequency being greater than the first frequency.

In an embodiment, the at least one unselected memory device is two or more unselected memory devices and the idle time interval is a sum of idle time intervals of the two or more unselected memory devices. When the idle time interval is greater than a threshold time interval, the memory controller may generate the clock signal based on a first frequency during an initial operation period, and generate the clock signal based on a second frequency during a normal operation period after the initial operation period, the second frequency being greater than the first frequency.

BRIEF DESCRIPTION OF THE DRAWINGS

FIGS. 14A and 14B are timing diagrams for describing a method of operating a memory controller in accordance with an embodiment of the present disclosure.

FIG. 17 is a flowchart illustrating step S140 of FIG. 13 in accordance with an embodiment of the present disclosure.

DETAILED DESCRIPTION

Specific structural or functional descriptions in embodiments of the present disclosure introduced in this specification or application are only for description of the embodiments of the present disclosure. The descriptions should not be construed as being limited to the embodiments described in the specification or application.

Figure 1:
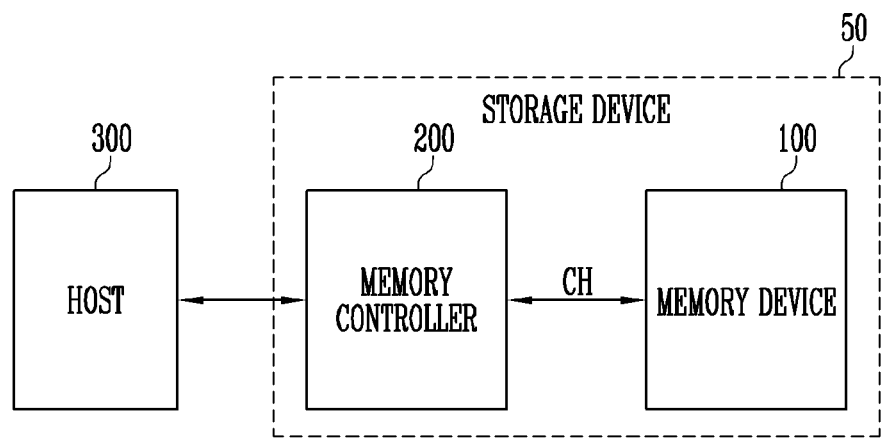
FIG. 1 is a block diagram illustrating a storage device in accordance with an embodiment.

FIG. 1 is a block diagram illustrating a storage device 50 in accordance with an embodiment.

Referring to FIG. 1, the storage device 50 may include a memory device 100 and a memory controller 200.

The storage device 50 may be a device configured to store data under control of a host 300 such as a cellular phone, a smartphone, an MP3 player, a laptop computer, a desktop computer, a game machine, a TV, a tablet PC, or an in-vehicle infotainment system.

The storage device 50 may be manufactured as any one of various kinds of storage devices depending on a host interface, which is a communication system for communicating with the host 300. For example, the data storage device 50 may be configured of any one of various kinds of storage devices such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of any one of various package types. For instance, the storage device 50 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data therein. The memory device 100 may operate under control of the memory controller 200. The memory device 100 may communicate with the memory controller 200 through a channel CH. The memory device 100 may include a memory cell array including a plurality of memory cells configured to store data therein. The memory cell array may include a plurality of memory blocks. Each memory block may include a plurality of memory cells. A plurality of memory cells may form a plurality of pages. In an embodiment, each page may be the unit of storing data in the memory device 100 or reading stored data from the memory device 100. Each memory block may be the unit of erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR) SDRAM, a rambus dynamic random access memory (RDRAM), a NAND flash memory, a vertical NAND flash memory, a NOR flash memory device, a resistive random access memory (RRAM), a phase-change memory (PRAM), a magneto-resistive random access memory (MRAM), a ferroelectric random access memory (FRAM), or a spin transfer torque random access memory (STT-RAM). In this specification, for the sake of explanation, it is assumed that the memory device 100 is a NAND flash memory.

The memory device 100 may be implemented in a two-dimensional array structure or a three-dimensional array structure. Hereinafter, although a three-dimensional array structure will be described for illustrative purposes, embodiments of the present disclosure are not limited to the three-dimensional array structure. Embodiments of the present disclosure may be applied not only to a flash memory in which a charge storage layer is formed of a conductive floating gate (FG), but also to a charge trap flash (CTF) memory in which a charge storage layer is formed of an insulating layer.

In an embodiment, the memory device 100 may operate in a single-level cell (SLC) manner of storing one data bit in each memory cell. Alternatively, the memory device 100 may operate in a manner of storing at least two data bits in each memory cell. For example, the memory device 100 may operate in a multi-level cell (MLC) manner of storing two data bits in each memory cell, a triple-level cell (TLC) manner of storing three data bits in each memory cell, or a quad-level cell (QLC) manner of storing four data bits in each memory cell.

The memory device 100 may receive a command and an address from the memory controller 200 through the channel CH and access an area of the memory cell array that is selected by the address. In other words, the memory device 100 may perform an operation corresponding to the command on the area selected by the address. For example, the memory device 100 may perform a write operation (or a program operation), a read operation, or an erase operation, in response to a received command. For example, when a program command is received, the memory device 100 may program data in an area selected by an address. If a read command is received, the memory device 100 may read data from an area selected by an address. If an erase command is received, the memory device 100 may erase data from an area selected by an address.

In an embodiment, the memory device 100 may be provided as a plurality of memory devices. In other words, a plurality of memory devices may be included in the storage device 50.

The plurality of memory devices may be coupled with the memory controller 200 through channels CH, and communicate with the memory controller 200 through the channels CH. For example, the memory controller 200 may instruct each of the plurality of memory devices to perform an operation. Each of the plurality of memory devices may perform an operation corresponding to the instruction of the memory controller 200. Furthermore, each of the plurality of memory devices may output a result of performing the corresponding operation to the memory controller 200.

The memory controller 200 may control overall operations of the storage device 50.

When a power supply voltage is applied to the storage device 50, the memory controller 200 may execute firmware (FW). In the case where the memory device 100 is a flash memory device, the memory controller 200 may execute firmware such as a flash translation layer (FTL) for controlling communication between the host 300 and the memory device 100.

In an embodiment, the memory controller 200 may include firmware which receives data and a logical block address (LBA) from the host 300, and translates the LBA into a physical block address (PBA) indicating addresses of memory cells in which data is to be stored, the memory cells being included in the memory device 100. The memory controller 200 may store, in a buffer memory, a logical-physical address mapping table indicating mapping relationship between logical block addresses LBA and physical block addresses PBA.

The memory controller 200 may control the memory device 100 to perform a program operation, a read operation, or an erase operation in response to a request from the host 300. For example, if a program request is received from the host 300, the memory controller 200 may change the program request into a program command, and provide the program command, a PBA, and data to the memory device 100. If a read request along with an LBA is received from the host 300, the memory controller 200 may change a read request into a read command, select a PBA corresponding to the LBA, and provide the read command and the PBA to the memory device 100. If an erase request along with an LBA is received from the host 300, the memory controller 200 may change the erase request into an erase command, select a PBA corresponding to the LBA, and provide the erase command and the PBA to the memory device 100.

In an embodiment, the memory controller 200 may autonomously generate a program command, an address, and data without a request from the host 300, and transmit them to the memory device 100. For example, the memory controller 200 may provide a command, an address, and data to the memory device 100 to perform background operations such as a program operation for wear leveling, and a program operation for garbage collection.

In an embodiment, the storage device 50 may further include a buffer memory (not illustrated). The memory controller 200 may control data exchange between the host 300 and the buffer memory (not illustrated). Alternatively, the memory controller 200 may temporarily store system data for controlling the memory device 100 in the buffer memory. For example, the memory controller 200 may temporarily store data input from the host 300 in the buffer memory, and thereafter transmit the data temporarily stored in the buffer memory to the memory device 100.

In various embodiments, the buffer memory may be used as an operating memory or a cache memory of the memory controller 200. The buffer memory may store codes or commands to be executed by the memory controller 200. Alternatively, the buffer memory may store data to be processed by the memory controller 200.

In an embodiment, the buffer memory may be embodied using an SRAM or a DRAM such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or a rambus dynamic random access memory (RDRAM).

In various embodiments, the buffer memory may be provided outside the storage device 50. In this case, volatile memory devices provided outside the storage device 50 may function as the buffer memory.

In an embodiment, the memory controller 200 may control at least two or more memory devices. In this case, the memory controller 200 may control the memory devices in an interleaving manner so as to enhance the operating performance.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multi-media card (MMC), embedded MMC (eMMC), dual in-line memory module (DIMM), registered DIMM (RDIMM), and load reduced DIMM (LRDIMM) communication methods.

Figure 2:
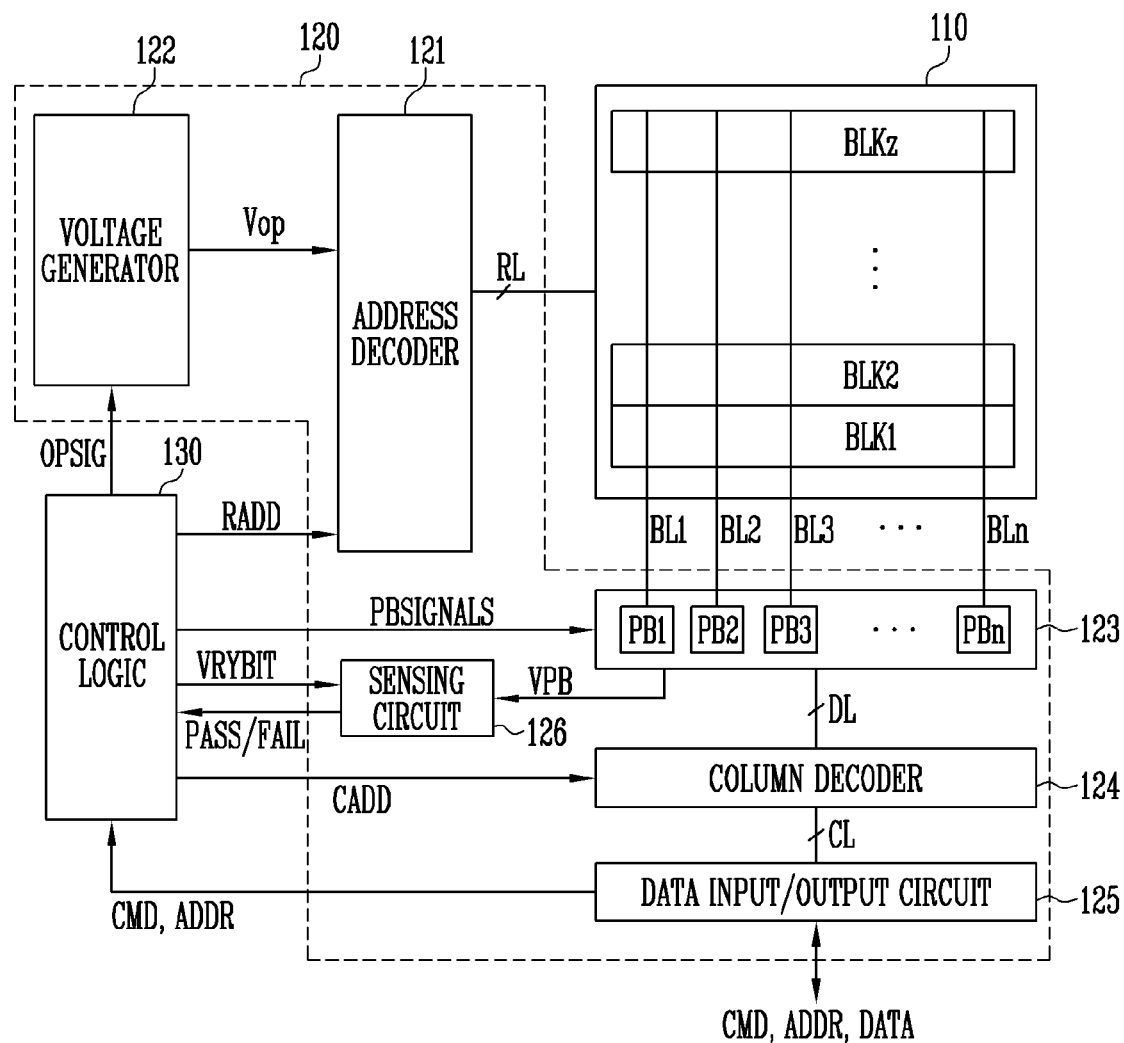
FIG. 2 is a diagram illustrating the configuration of a memory device of FIG. 1 in accordance with an embodiment.

FIG. 2 is a diagram illustrating the configuration of the memory device 100 of FIG. 1 in accordance with an embodiment.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz are coupled to an address decoder 121 through row lines RL. The plurality of memory blocks BLK1 to BLKz may be coupled to a page buffer group 123 through bit lines BL1 to BLn. Each of the memory blocks BLK1 to BLKz may include a plurality of memory cells. In an embodiment, the plurality of memory cells may be nonvolatile memory cells. Memory cells coupled to the same word line may be defined as one page. Hence, each memory block may include a plurality of pages.

The row lines RL may include at least one source select line, a plurality of word lines, and at least one drain select line.

Each of the memory cells included in the memory cell array 110 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may perform a program operation, a read operation, or an erase operation on a selected area of the memory cell array 110 under control of the control logic 130. The peripheral circuit 120 may drive the memory cell array 110. For example, the peripheral circuit 120 may apply various operating voltages to the row lines RL and the bit lines BL1 to BLn or discharge the applied voltages, under control of the control logic 130.

The peripheral circuit 120 may include the address decoder 121, a voltage generator 122, the page buffer group 123, a column decoder 124, an input/output circuit 125, and a sensing circuit 126.

The address decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The address decoder 121 may decode a row address RADD received from the control logic 130. The address decoder 121 may select at least one memory block of the memory blocks BLK1 to BLKz in response to the decoded address. The address decoder 121 may select at least one word line of the selected memory block in response to the decoded address so that voltages generated from the voltage generator 122 are applied to the at least one word line.

For example, during a program operation, the address decoder 121 may apply a program voltage to a selected word line and apply a program pass voltage having a level lower than that of the program voltage to unselected word lines. During a program verify operation, the address decoder 121 may apply a verify voltage to a selected word line and apply a verify pass voltage higher than the verify voltage to unselected word lines. During a read operation, the address decoder 121 may apply a read voltage to a selected word line and apply a read pass voltage higher than the read voltage to unselected word lines.

In an embodiment, an erase operation of the memory device 100 may be performed on a memory block basis. During an erase operation, the address decoder 121 may select one memory block in response to a decoded address. During the erase operation, the address decoder 121 may apply a ground voltage to word lines coupled to the selected memory block.

The voltage generator 122 may operate under control of the control logic 130. The voltage generator 122 may generate a plurality of voltages using an external supply voltage supplied to the memory device 100. In detail, the voltage generator 122 may generate various operating voltages Vop to be used for a program operation, a read operation, and an erase operation in response to an operating signal OPSIG. For example, the voltage generator 122 may generate a program voltage, a verify voltage, a pass voltage, a read voltage, an erase voltage, and so forth under control of the control logic 130.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of voltages using an external power supply voltage or an internal power supply voltage.

For example, the voltage generator 122 may include a plurality of pumping capacitors for receiving the internal supply voltage and generate a plurality of voltages by selectively activating the plurality of pumping capacitors under control of the control logic 130.

The generated voltages may be supplied to the memory cell array 110 by the address decoder 121.

The page buffer group 123 may include first to n-th page buffers PB1 to PBn. The first to n-th page buffers PB1 to PBn are coupled to the memory cell array 110 through the first to n-th bit lines BL1 to BLn, respectively. The first to n-th page buffers PB1 to PBn may operate under control of the control logic 130. In detail, the first to n-th page buffers PB1 to PBn may operate in response to page buffer control signals PBSIGNALS. For instance, the first to n-th page buffers PB1 to PBn may temporarily store data received through the first to n-th bit lines BL1 to BLn, or sense voltages or currents of the first to n-th bit lines BL1 to BLn during a read operation or a verify operation.

In detail, during a program operation, the first to n-th page buffers PB1 to PBn may transmit data DATA received through the input/output circuit 125 to selected memory cells through the first to n-th bit lines BL1 to BLn when a program voltage is applied to a selected word line. The memory cells in the selected page are programmed based on the transmitted data DATA. During a program verify operation, the first to n-th page buffers PB1 to PBn may read page data by sensing voltages or currents received from selected memory cells through the first to n-th bit lines BL1 to BLn.

During a read operation, the first to n-th page buffers PB1 to PBn may read data DATA from memory cells of a selected page through the first to n-th bit lines BL1 to BLn, and output the read data DATA to the data input/output circuit 125 under control of the column decoder 124.

During an erase operation, the first to n-th page buffers PB1 to PBn may float the first to n-th bit lines BL1 to BLn or apply erase voltages thereto.

The column decoder 124 may transmit data between the input/output circuit 125 and the page buffer group 123 in response to a column address CADD. For example, the column decoder 124 may exchange data with the first to n-th page buffers PB1 to PBn through data lines DL or exchange data with the input/output circuit 125 through column lines CL.

The input/output circuit 125 may transmit, to the control logic 130, a command CMD or an address ADDR received from a memory controller (e.g., the memory controller 200 of FIG. 1), or may exchange data DATA with the column decoder 124.

During a read operation or a verify operation, the sensing circuit 126 may generate a reference current in response to an enable bit signal VRYBIT, and may compare a sensing voltage VPB received from the page buffer group 123 with a reference voltage generated by the reference current and output a pass signal PASS or a fail signal FAIL.

The control logic 130 may output an operating signal OPSIG, a row address RADD, page buffer control signals PBSIGNALS, and an enable bit signal VRYBIT in response to a command CMD and an address ADD, and thus control the peripheral circuit 120. For example, the control logic 130 may control a read operation of a selected memory block in response to a sub-block read command and an address. Furthermore, the control logic 130 may control an erase operation of a selected sub-block included in a selected memory block, in response to a sub-block erase command and an address. In addition, the control logic 130 may determine whether a target memory cell has passed a verification during a verify operation in response to a pass signal PASS or a fail signal FAIL.

Each of the memory cells included in the memory cell array 110 may be programmed to any one programmed state among a plurality of programmed states depending on data to be stored in the corresponding memory cell. A target programmed state of a memory cell may be determined to be any one of the plurality of programmed states depending on data to be stored therein.

Figure 3:
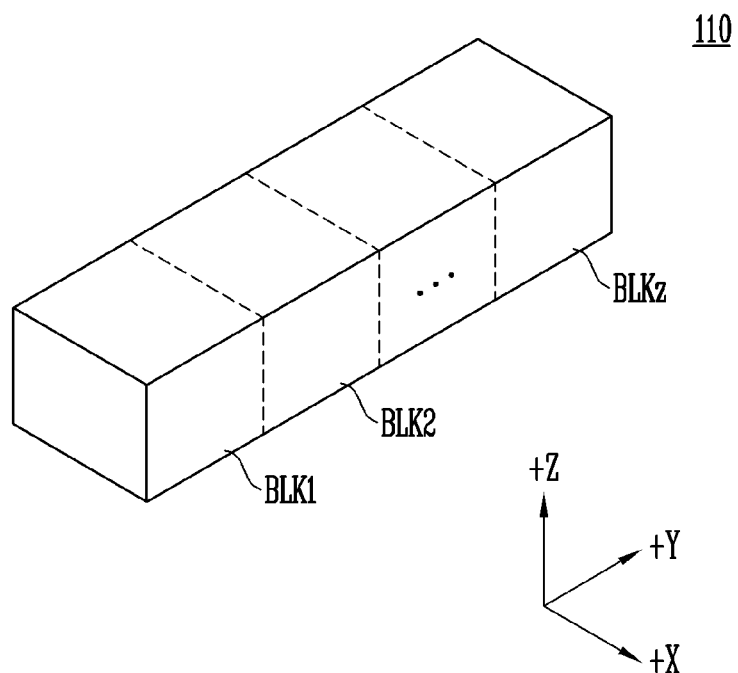
FIG. 3 is a diagram illustrating a memory cell array of FIG. 2 in accordance with an embodiment.

FIG. 3 is a diagram illustrating the memory cell array 110 of FIG. 2 in accordance with an embodiment.

Referring to FIG. 3, the memory cell array 110 may include a plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 4 and 5.

Figure 4:
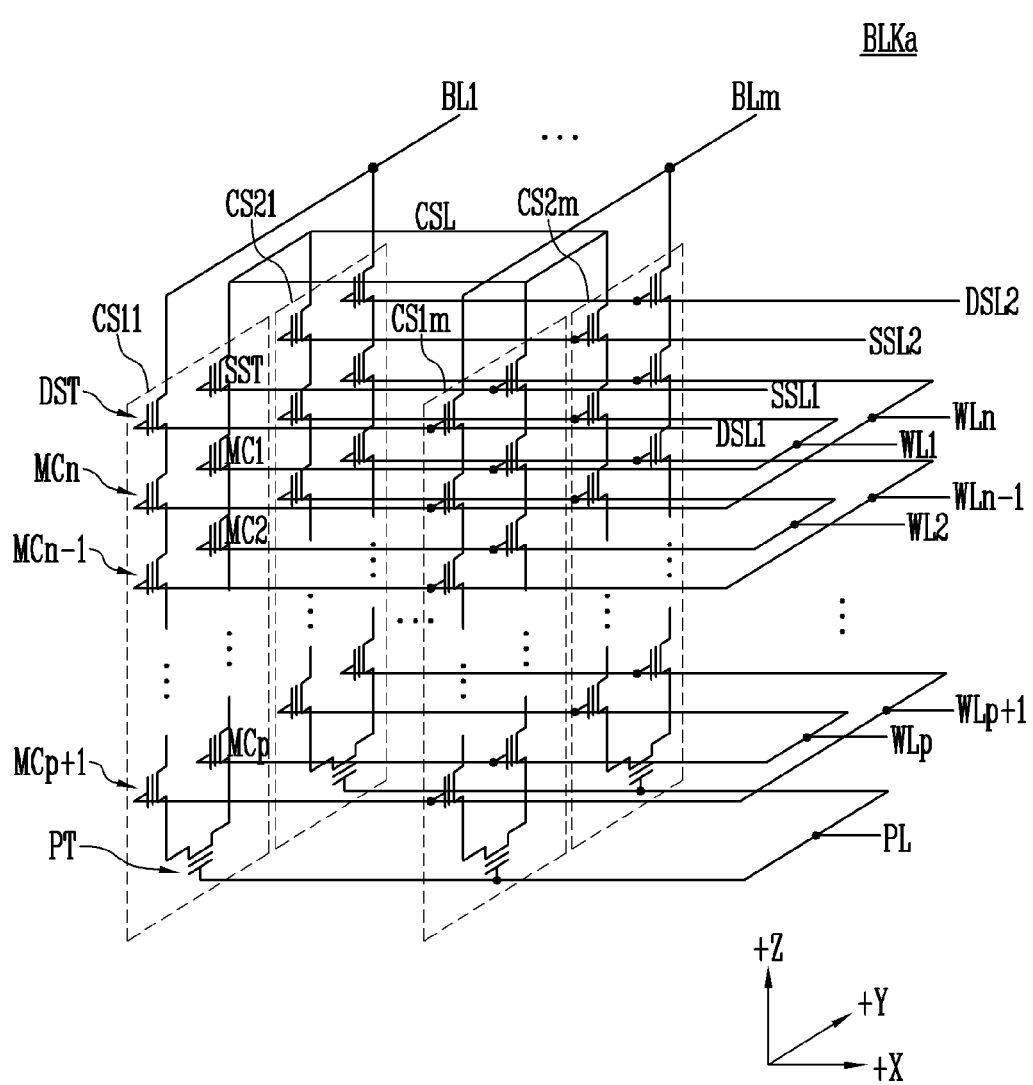
FIG. 4 is a circuit diagram illustrating a memory block of a plurality of memory blocks of FIG. 2 in accordance with an embodiment.

FIG. 4 is a circuit diagram illustrating a memory block BLKa of the memory blocks BLK1 to BLKz of FIG. 2 in accordance with an embodiment.

Referring to FIG. 4, the memory block BLKa may include a plurality of cell strings CS11 to CS1$m$ and CS21 to CS2$m$. In an embodiment, each of the cell strings CS11 to CS1$m$ and CS21 to CS2$m$ may be formed in a 'U' shape. In the memory block BLKa, m cell strings may be arranged in a row direction (i.e., the +X direction). In FIG. 4, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1$m$ and CS21 to CS2$m$ may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 4, source select transistors of the cell strings CS11 to CS1$m$ in a first row are coupled to a first source select line SSL1. Source select transistors of the cell strings CS21 to CS2$m$ in a second row are coupled to a second source select line SSL2.

In an embodiment, the source select transistors of the cell strings CS11 to CS1$m$ and CS21 to CS2$m$ may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1$m$ in the first row are coupled to a first drain select line DSL1. Drain select transistors of the cell strings CS21 to CS2$m$ in the second row are coupled to a second drain select line DSL2.

Cell strings arranged in the column direction may be coupled to bit lines extending in the column direction. In FIG. 4, cell strings CS11 and CS21 in a first column are coupled to a first bit line BL1. Cell strings CS1$m$ and CS2$m$ in an m-th column are coupled to an m-th bit line BLm.

Memory cells coupled to the same word line in cell strings arranged in the row direction form a single page. For example, memory cells coupled to the first word line WL1, among the cell strings CS11 to CS1$m$ in the first row, form a single page. Memory cells coupled to the first word line WL1, among the cell strings CS21 to CS2$m$ in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number cell strings of the cell strings CS11 to CS1$m$ or CS21 to CS2$m$ arranged in the row direction may be coupled to respective even bit lines. Odd-number cell strings of the cell strings CS11 to CS1$m$ or CS21 to CS2$m$ arranged in the row direction may be coupled to respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCp. Alternatively, at least one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the at least one dummy memory cells, each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 5:
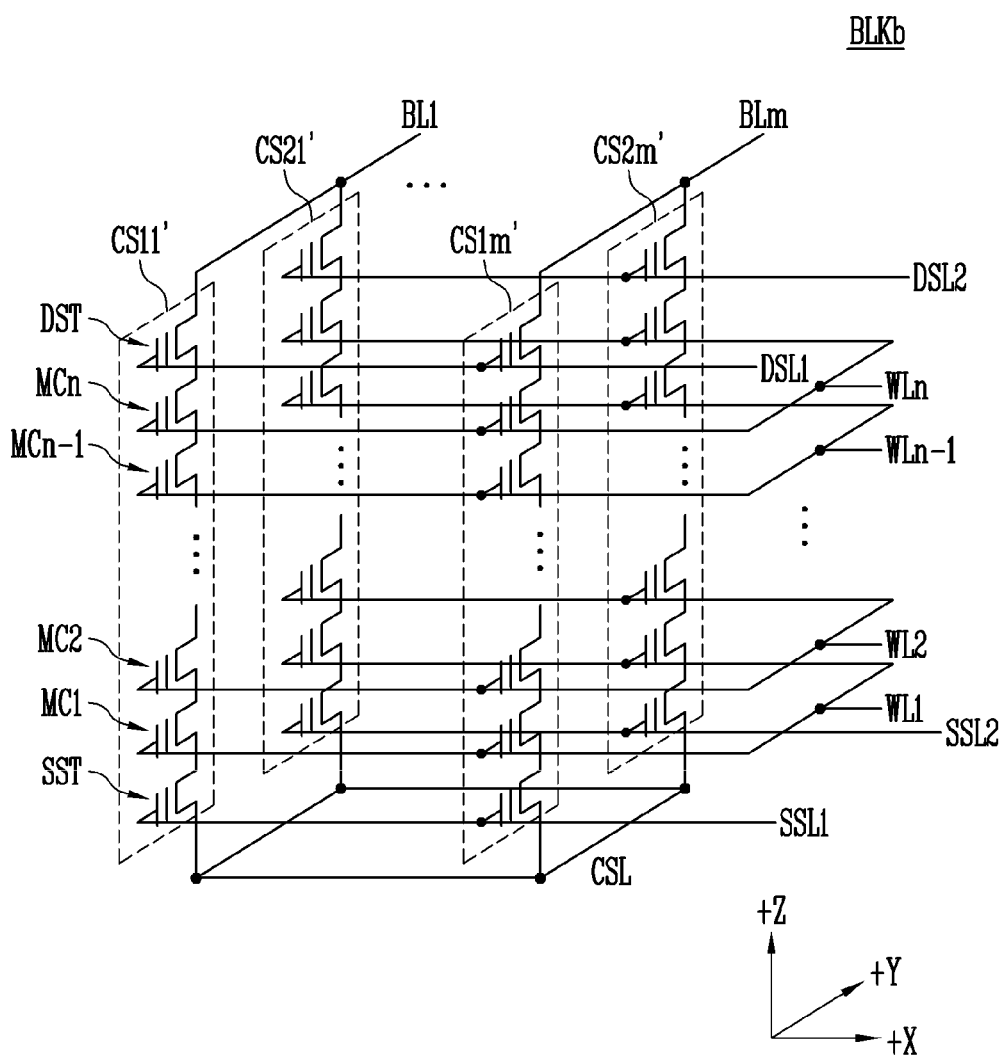
FIG. 5 is a circuit diagram illustrating a memory block of the plurality of memory blocks of FIG. 2, in accordance with an embodiment.

FIG. 5 is a circuit diagram illustrating a memory block BLKb of the memory blocks BLK1 to BLKz of FIG. 2, in accordance with an embodiment.

Referring to FIG. 5, the memory block BLKb may include a plurality of cell strings CS11' to CS1m' and CS21' to CS2m'. Each of the cell strings CS11' to CS1m' and CS21' to CS2m' extends in the +Z direction. Each of the cell strings CS11' to CS1m' and CS21' to CS2m' may include at least one source select transistor SST, first to n-th memory cells MC1 to MCn, and at least one drain select transistor DST which are stacked on a substrate (not shown) provided in a lower portion of the memory block BLKb.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

Consequently, the memory block BLKb of FIG. 5 may have an equivalent circuit similar to that of the memory block BLKa of FIG. 4 except that a pipe transistor PT of FIG. 4 is excluded from each cell string of the memory block BLKb of FIG. 5.

In an embodiment, even bit lines and odd bit lines may be provided in lieu of the first to m-th bit lines BL1 to BLm. Even-number cell strings among the cell strings CS11' to CS1m' or CS21' to CS2m' arranged in the row direction may be coupled to the respective even bit lines, and odd-number cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the at least one dummy memory cells, each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 6:
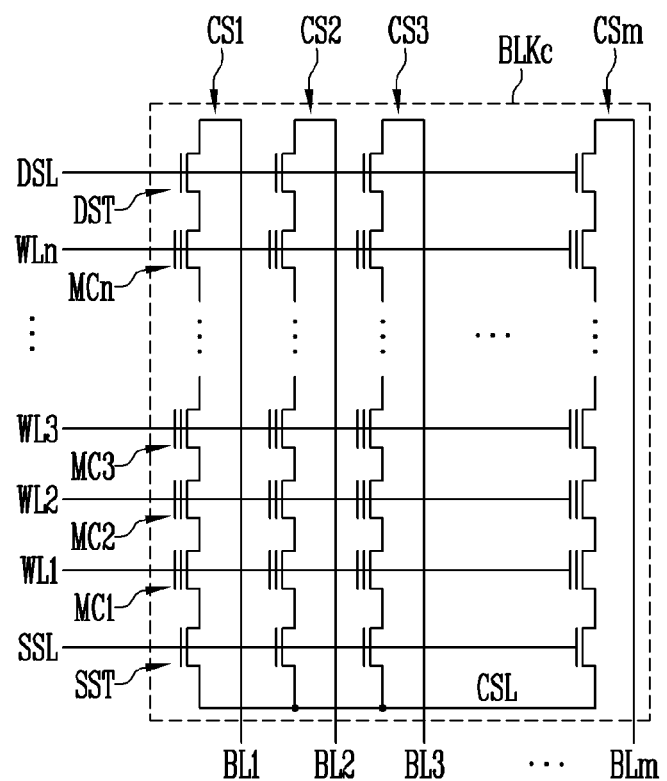
FIG. 6 is a circuit diagram illustrating a memory block of the plurality of memory blocks of FIG. 2, in accordance with an embodiment.

FIG. 6 is a circuit diagram illustrating a memory block BLKc of the memory blocks BLK1 to BLKz included in the memory cell array 110 of FIG. 2, in accordance with an embodiment.

Referring to FIG. 6, the memory block BLKc includes a plurality of cell strings CS1 to CSm. The plurality of cell strings CS1 to CSm may be respectively coupled to a plurality of bit lines BL1 to BLm. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

Memory cells coupled to the same word line may form a single page. The cell strings CS1 to CSm may be selected by selecting the drain select line DSL. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-number cell strings of the cell strings CS1 to CSm may be coupled to the respective even bit lines, and odd-number cell strings may be coupled to the respective odd bit lines.

As illustrated in FIGS. 3 to 5, the memory cell array 110 of the memory device 100 may be formed of a memory cell array having a three-dimensional structure. Furthermore, as illustrated in FIG. 6, the memory cell array 110 of the memory device 100 may be formed of a memory cell array having a two-dimensional structure.

Figure 7:
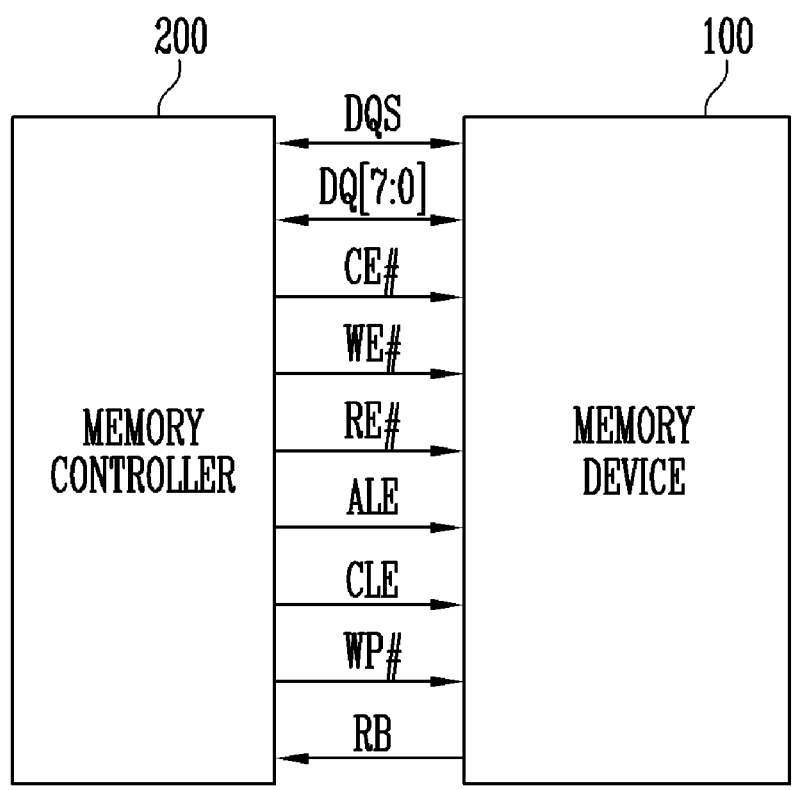
FIG. 7 is a diagram illustrating signals which are exchanged between a memory controller and a memory device in accordance with an embodiment.

FIG. 7 is a diagram illustrating signals which are exchanged between a memory controller 200 and a memory device 100 in accordance with an embodiment. Referring to FIG. 7, the memory controller 200 and the memory device 100 may exchange one or more signals DQ[7:0] each indicating a command, data, and an address through a data pad. Furthermore, the memory controller 200 and the memory device 100 may exchange a data strobe signal DQS through a data strobe pad. The memory device 100 may receive a chip enable signal CE #, a write enable signal WE #, a read enable signal RE #, an address latch enable signal ALE, a command latch enable signal CLE, a write protection signal WP #, etc. Also, the memory device 100 may output a ready/busy signal RB through a ready/busy pad.

To perform a program operation of the memory device 100, the memory controller 200 may output a data strobe signal DQS through the data strobe pad. In synchronization with the data strobe signal DQS output through the data strobe pad, the memory controller 200 may output a program command, an address, and program data through the data pad.

To perform a read operation of the memory device 100, the memory controller 200 may output a read enable signal RE # through a read enable pad. In response to the read enable signal RE #, the memory device 100 may output a data strobe signal DQS. In synchronization with the data strobe signal DQS, the memory device 100 may output read data through the data pad.

During a program operation of the memory device 100, the memory controller 200 may output a data strobe signal DQS to the memory device 100, and output program data to the memory device 100 through the data pad. During a read operation of the memory device 100, the memory device 100 may output a data strobe signal DQS to the memory controller 200, and output read data to the memory controller 200 through the data pad.

Figure 8:
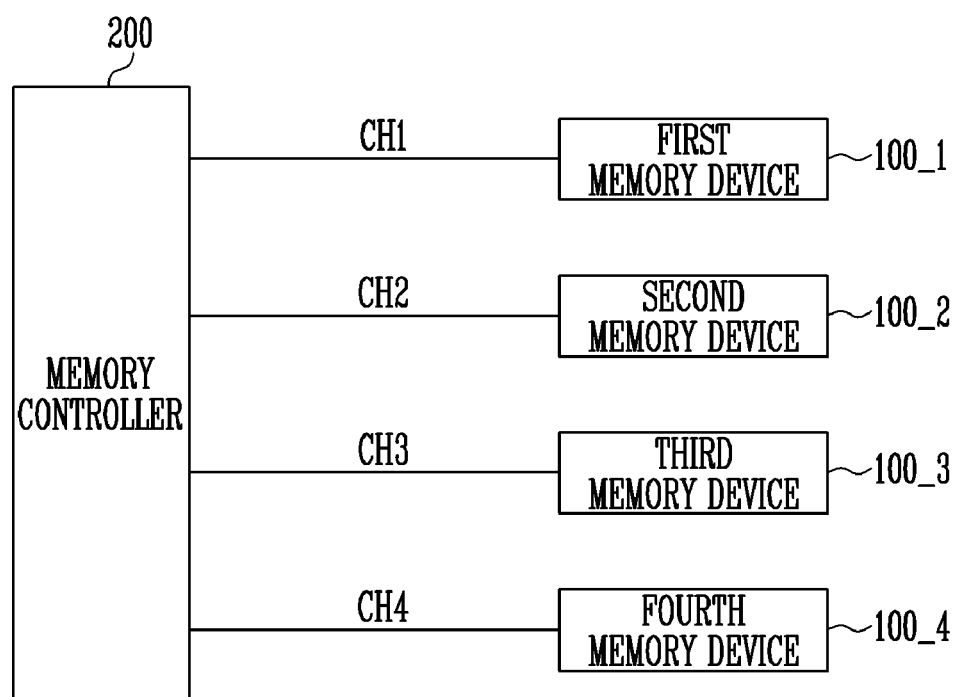
FIG. 8 is a diagram illustrating memory devices coupled to a plurality of channels in accordance with an embodiment.

FIG. 8 is a diagram illustrating memory devices coupled to a plurality of channels in accordance with an embodiment.

FIG. 8 illustrates the case where a plurality of memory devices included in a storage device (e.g., the storage device 50 of FIG. 1) are coupled to a memory controller 200. In FIG. 8, it is assumed that the plurality of memory devices coupled to the memory controller 200 include first to fourth memory devices 100_1 to 100_4, i.e., a total of four memory devices. However, embodiments of the present disclosure are not limited thereto, and the number of memory devices coupled to the memory controller 200 may vary according to embodiments.

In an embodiment, a plurality of memory devices may be coupled to the memory controller 200. For example, the memory controller 200 may be coupled to the first memory device 100_1 through a first channel CH1, the second memory device 100_2 through a second channel CH2, the third memory device 100_3 through a third channel CH3, and the fourth memory device 100_4 through a fourth channel CH4.

The memory controller 200 may generate a command corresponding to a request received from a host (e.g., the host 300 of FIG. 1) and output the command to any one of the first to fourth memory devices 100_1 to 100_4. The request received from the host 300 may be a program request, a read request, or an erase request for any one of the first to fourth memory devices 100_1 to 100_4.

For example, if a request received from the host 300 is a read request for the first memory device 100_1, the memory controller 200 may generate a command corresponding to the read request and output the command to the first memory device 100_1 through the first channel CH1. Here, the memory controller 200 may output not only the command corresponding to the read request but also an address corresponding to the read request to the first memory device 100_1 through the first channel CH1.

If a request received from the host 300 is a program request for the second memory device 100_2, the memory controller 200 may generate a command corresponding to the program request and output the command to the second memory device 100_2 through the second channel CH2. Here, an address and data corresponding to the program request may also be output to the second memory device 100_2 through the second channel CH2.

As described above, the memory controller 200 may generate one or more of a command, an address, and data corresponding to a request received from the host 300. If the request is a request for the first memory device 100_1, the first channel 1 may be used to output the generated one or more of command, address, and data. If the request is a request for the second memory device 100_2, the second channel 2 may be used. If the request is a request for the third memory device 100_3, the third channel 3 may be used. If the request is a request for the fourth memory device 100_4, the fourth channel CH4 may be used.

As such, the memory controller 200 may communicate with a plurality of memory devices through a plurality of channels.

In an embodiment, in the case where the plurality of memory devices perform operations corresponding to commands received through the channels, respectively, current consumption may be increased. Particularly, if the plurality of memory devices start operations substantially at the same time, the entire current consumption of the plurality of memory devices may be rapidly increased. In the case the entire current consumption is rapidly increased, a noise occurs on a voltage source, thereby deteriorating the operational reliability of the storage device 50. For example, the plurality of memory devices may share a single voltage source, and thus such a relatively high increase of the entire current consumption by the plurality of memory devices may lead to an occurrence of a noise on the voltage source.

In the memory controller 200 according to an embodiment of the present disclosure, when each of the memory devices 100_1 to 100_4 starts an operation, an initial frequency of a clock signal output may be controlled based on an idle time of each of the memory devices 100_1 to 100_4. In an embodiment, the clock signal that is output from the memory controller 200 may be a read enable signal RE # which is output during a read operation, or a data strobe signal DQS which is output during a program operation. In the memory controller 200 in accordance with an embodiment of the present disclosure, if the idle time of a memory device 100_1, 100_2, 100_3, or 100_4 exceeds a threshold time, a clock signal to be output to the memory device may be generated based on an initial frequency (or initial operation frequency) less than a normal frequency during an initial frequency scaling period. In an embodiment, when the idle time of a memory device 100_1, 100_2, 100_3, or 100_4 exceeds a threshold time, the memory controller 200 may generate a clock signal having an initial frequency during an initial frequency scaling period, the initial frequency being less than a normal frequency. If the initial frequency scaling period has passed and the process enters a normal operation period, the memory controller may generate clock signals to be output to the memory devices 100_1 to 100_4 based on the normal frequency. Therefore, if the plurality of memory devices 100_1 to 100_4 start operations substantially at the same time, the entire current consumption of the storage device 50 may be prevented from rapidly increasing by reducing an initial operation frequency of each of the clock signals output from the memory devices 100_1 to 100_4 during the initial frequency scaling period compared to the normal frequency.

Figure 9:
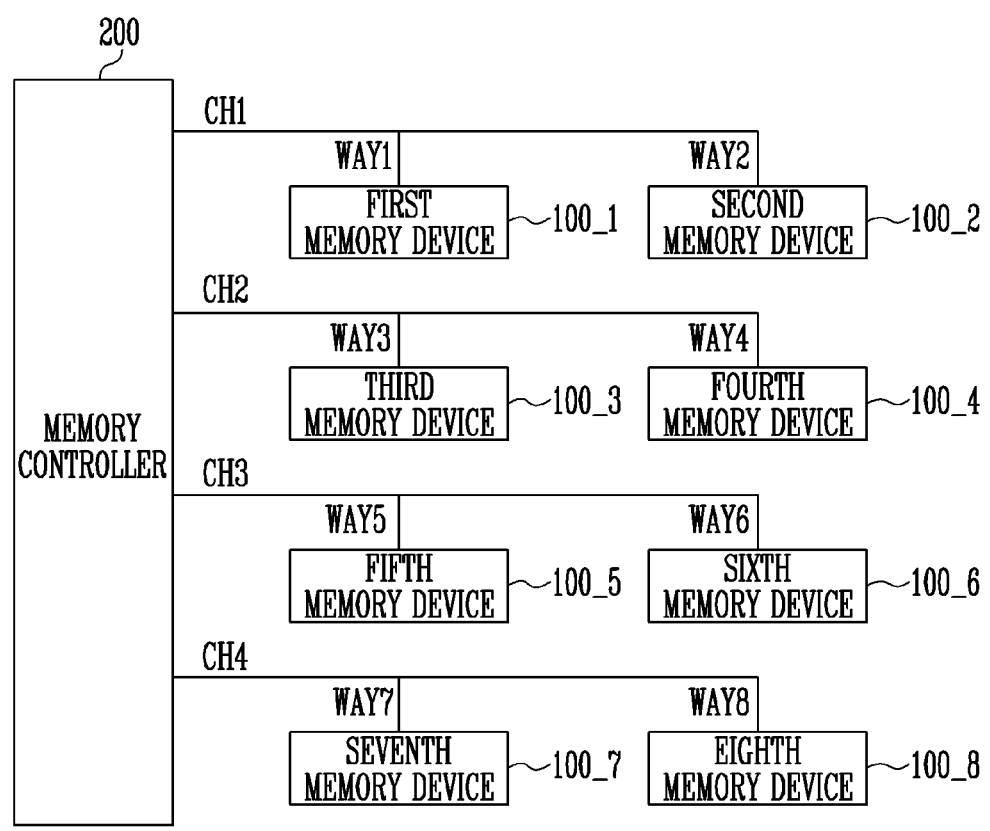
FIG. 9 is a diagram illustrating memory devices coupled to a plurality of channels in accordance with an embodiment.

FIG. 9 is a diagram illustrating memory devices coupled to a plurality of channels in accordance with an embodiment.

Referring to FIGS. 8 and 9, first to eighth memory devices 100_1 to 100_8 of FIG. 9 may be coupled to the memory controller 200 through first to fourth channels CH1 to CH4, in a similar manner to that described with reference to FIG. 8. However, FIG. 8 illustrates the case where a single memory device is coupled to each channel. FIG. 9 illustrates the case where two memory devices are coupled to each channel. In another embodiment, three or more memory devices may be coupled to each channel.

In an embodiment, the first memory device 100_1 is coupled to the first channel CH1 through a first way WAY1, and the second memory device 100_2 is coupled to the first channel CH1 through a second way WAY2. The first and second memory devices 100_1 and 100_2 may be coupled to the memory controller 200 through the first channel CH1. The third memory device 100_2 is coupled to the second channel CH2 through a third way WAY3, and the fourth memory device 100_4 is coupled to the second channel CH2 through a fourth way WAY4. Hence, the third and fourth memory devices 100_3 and 100_4 may be coupled to the memory controller 200 through the second channel CH2.

In an embodiment, the fifth memory device 100_5 is coupled to the third channel CH3 through a fifth way WAY5, and the sixth memory device 100_6 is coupled to the third channel CH3 through a sixth way WAY6. Hence, the fifth and sixth memory devices 100_5 and 100_6 may be coupled to the memory controller 200 through the third channel CH3. The seventh memory device 100_7 is coupled to the fourth channel CH4 through a seventh way WAY7, and the eighth memory device 100_8 is coupled to the fourth channel CH4 through an eighth way WAY8. Hence, the seventh and eighth memory devices 100_7 and 100_8 may be coupled to the memory controller 200 through the fourth channel CH4.

In an embodiment, the memory controller 200 may generate a command corresponding to a request from a host (e.g., the host 300 of FIG. 1) and output the command to any one of the first to eighth memory devices 100_1 to 100_8. The request received from the host 300 may be a program request, a read request, or an erase request for any one of the first to eighth memory devices 100_1 to 100_8.

For example, if a request received from the host 300 is a read request for the first memory device 100_1, the memory controller 200 may generate a command corresponding to the read request and output the command to the first memory device 100_1 through the first channel CH1. Here, the memory controller 200 may output not only the command corresponding to the read request but also an address corresponding to the read request to the first memory device 100_1 through the first channel CH1.

If a request received from the host 300 is a program request for the second memory device 100_2, the memory controller 200 may generate a command corresponding to the program request and output the command to the second memory device 100_2 through the first channel CH1. Here, an address and data corresponding to the program request may also be output to the second memory device 100_2 through the first channel CH1.

As described above, if a request received from the host 300 is a request for the first memory device 100_1 or the second memory device 100_2, the memory controller 200 may output one or more of a command, an address, and data corresponding to the request from the host 300 to the first memory device 100_1 or the second memory device 100_2 through the first channel CH1. If a request received from the host 300 is a request for the third memory device 100_3 or the fourth memory device 100_4, the memory controller 200 may output one or more of a command, an address, and data corresponding to the request from the host 300 to the third memory device 100_3 or the fourth memory device 100_4 through the second channel CH2.

In an embodiment, if a request received from the host 300 is a request for the fifth memory device 100_5 or the sixth memory device 100_6, the memory controller 200 may output one or more of a command, an address, and data corresponding to the request from the host 300 to the fifth memory device 100_5 or the sixth memory device 100_6 through the third channel CH3. If a request received from the host 300 is a request for the seventh memory device 100_7 or the eighth memory device 100_8, the memory controller 200 may output one or more of a command, an address, and data corresponding to the request from the host 300 to the seventh memory device 100_7 or the eighth memory device 100_8 through the fourth channel CH4.

In the same manner as described with reference to FIG. 8, the memory controller 200 may communicate with a plurality of memory devices through a plurality of channels.

In the memory controller 200 in accordance with an embodiment of the present disclosure, when each of the memory devices 100_1 to 100_8 starts an operation, an initial frequency of a clock signal output may be controlled based on an idle time of each of the memory devices 100_1 to 100_8. In an embodiment, the clock signal that is output from the memory controller 200 may be a read enable signal RE # which is output through the read enable pad during a read operation, or a data strobe signal DQS which is output through the DQS pad during a program operation. In the memory controller 200 in accordance with an embodiment of the present disclosure, if the idle time of one of the memory devices 100_1 to 100_8 exceeds a threshold time, a clock signal to be output to the memory device may be generated based on an initial frequency less than a normal frequency during an initial frequency scaling period. If the initial frequency scaling period has passed and the process enters a normal operation period, the memory controller 200 may generate clock signals to be output to the memory devices 100_1 to 100_8 based on the normal frequency. Therefore, if the plurality of memory devices 100_1 to 100_8 start operations substantially at the same time, the entire current consumption of the storage device 50 may be prevented from rapidly increasing by reducing the initial operation frequency of each of the clock signals output from the memory devices 100_1 to 100_8 during the initial frequency scaling period compared to the normal frequency.

Figure 10:
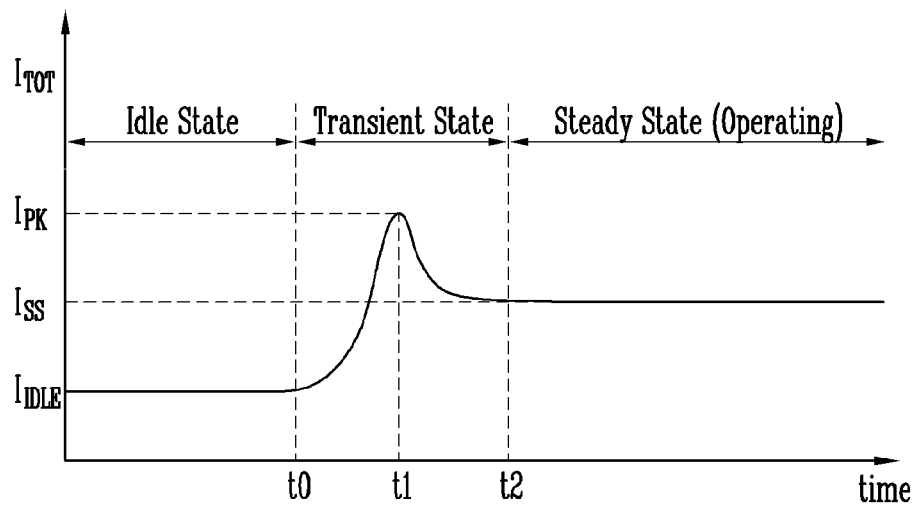
FIG. 10 is a diagram for describing a change in entire current consumption when memory devices coupled to a plurality of channels start operations substantially at the same time in accordance with an embodiment.

FIG. 10 is a diagram for describing a change in entire current consumption when memory devices coupled to a plurality of channels start operations substantially at the same time in accordance with an embodiment. Referring to FIG. 10, if a plurality of memory devices start or end operations substantially at the same time, a noise may occur on a voltage source Vsource.

For example, the plurality of memory devices may remain idle until time t0. In the idle state, a total current $I_{TOT}$ that is consumed in a storage device (e.g., the storage device 50 in FIG. 1) may be maintained at a relatively low idle state current $I_{IDLE}$. At a first time t0, the plurality of memory devices may start operations substantially at the same time. As the plurality of memory devices start the operations substantially at the same time, the total current $I_{TOT}$ that is consumed in the storage device 50 during a period from the first time t0 to a second time t1 may rapidly increase from the idle state current $I_{IDLE}$ to a peak current $I_{PK}$. The total current $I_{TOT}$ that has increased to the peak current $I_{PK}$ at the second time t1 may be reduced to a steady state current $I_{SS}$ from the second time t1 to a third time t2 as the operation of the storage device 50 is stabilized. The storage device 50 is in a transient state during a period from the first time t0 to the third time t2.

From the third time t2 after the transient state has been terminated, the storage device 50 may operate in a steady state. The total current $I_{TOT}$ that is consumed by the storage device 50 in the steady state may be stably maintained at the steady state current $I_{SS}$.

As illustrated in FIG. 10, in the case where the plurality of memory devices included in the storage device 50 start operations substantially at the same time, the total current $I_{TOT}$ that is consumed by the storage device 50 in the transient state may rapidly increase to the peak current $I_{PK}$. If each of the plurality of memory devices operates at a relatively high speed, the peak current $I_{PK}$ may have a relatively large magnitude.

In a memory controller (e.g., the memory controller 200 in FIG. 1) in accordance with an embodiment of the present disclosure, when a memory device in the storage device 50 starts an operation, an initial frequency of a clock signal output may be controlled based on an idle time of the memory device. In the memory controller 200 in accordance with an embodiment of the present disclosure, if the idle time of the memory device exceeds a threshold time, a clock signal to be output to the memory device may be generated based on an initial frequency less than a normal frequency during an initial frequency scaling period. If the initial frequency scaling period has passed and the process enters a normal operation period, the memory controller 200 may generate a clock signal to be output to the memory device based on the normal frequency. Therefore, even if a plurality of memory devices start operations substantially at the same time, the entire current consumption of the storage device 50 may be prevented from rapidly increasing by reducing the initial operation frequency of the clock signal from the memory device during the initial frequency scaling period compared to the normal frequency.

Figure 11:
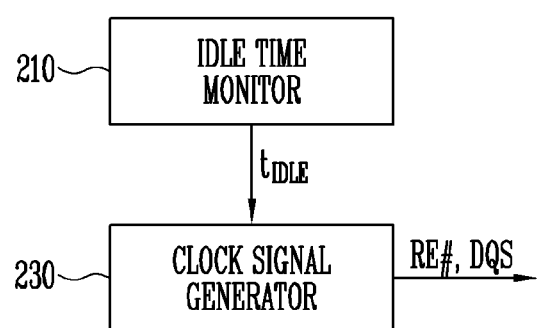
FIG. 11 is a block diagram illustrating a memory controller in accordance with an embodiment of the present disclosure.

FIG. 11 is a block diagram illustrating a memory controller 200 in accordance with an embodiment of the present disclosure.

Referring to FIG. 11, the memory controller 200 in accordance with an embodiment of the present disclosure may include an idle time monitor 210 and a clock signal generator 230. The idle time monitor 210 may monitor an idle time $t_{IDLE}$ of the memory device included in a storage device (e.g., the storage device 50 in FIG. 1) and output it to the clock signal generator 230. For example, the idle time monitor 210 may generate a signal indicative the idle time $t_{IDLE}$ of the memory device and output the generated signal to the clock signal generator 230. The clock signal generator 230 may generate a read enable signal RE # or a data strobe signal DQS based on the received idle time $t_{IDLE}$.

Figure 12:
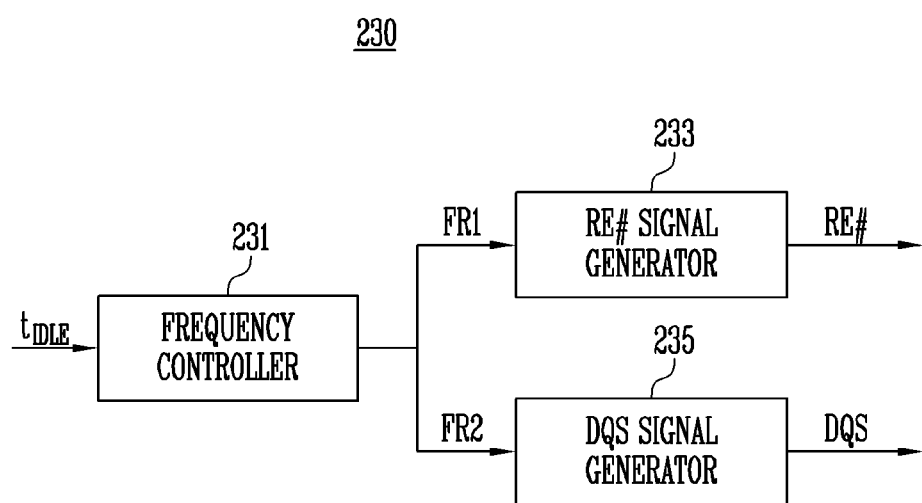
FIG. 12 is a block diagram illustrating a clock signal generator of FIG. 11 in accordance with an embodiment.

FIG. 12 is a block diagram illustrating the clock signal generator 230 of FIG. 11 in accordance with an embodiment of the present disclosure.

Referring to FIG. 12, the clock signal generator 230 may include a frequency controller 231, a read enable signal generator 233, and a data strobe signal generator 235.

The frequency controller 231 may receive an idle time $t_{IDLE}$ of the memory device and control a frequency of a clock signal to be output to the memory device. In other words, the frequency controller 231 may generate a frequency FR1 or FR2 for generating a clock signal and transmit the frequency FR1 or FR2 to the read enable signal generator 233 or the data strobe signal generator 235. For example, the frequency controller 231 may generate a first signal indicative of a first frequency FR1 and transmit the first signal to the read enable signal generator 233, or may generate a second signal indicative of a second frequency FR2 and transmit the second signal to the data strobe signal generator 235.

In more detail, during a read operation of the memory device, the memory controller 200 may generate a read enable signal RE #. In this case, the frequency controller 231 may control the frequency FR1 for generating the read enable signal RE # based on the idle time $t_{IDLE}$. During a program operation of the memory device, the memory controller 200 may generate a data strobe signal DQS. In this case, the frequency controller 231 may control the frequency FR2 for generating the data strobe signal DQS based on the idle time $t_{IDLE}$.

The read enable signal generator 233 may generate a read enable signal RE # based on the frequency FR1 that is controlled by the frequency controller 231. The data strobe signal generator 235 may generate a data strobe signal DQS based on the frequency FR2 that is controlled by the frequency controller 231.

An operation of the memory controller 200 in accordance with an embodiment of the present disclosure will be described below in detail with reference to FIG. 13.

Figure 13:
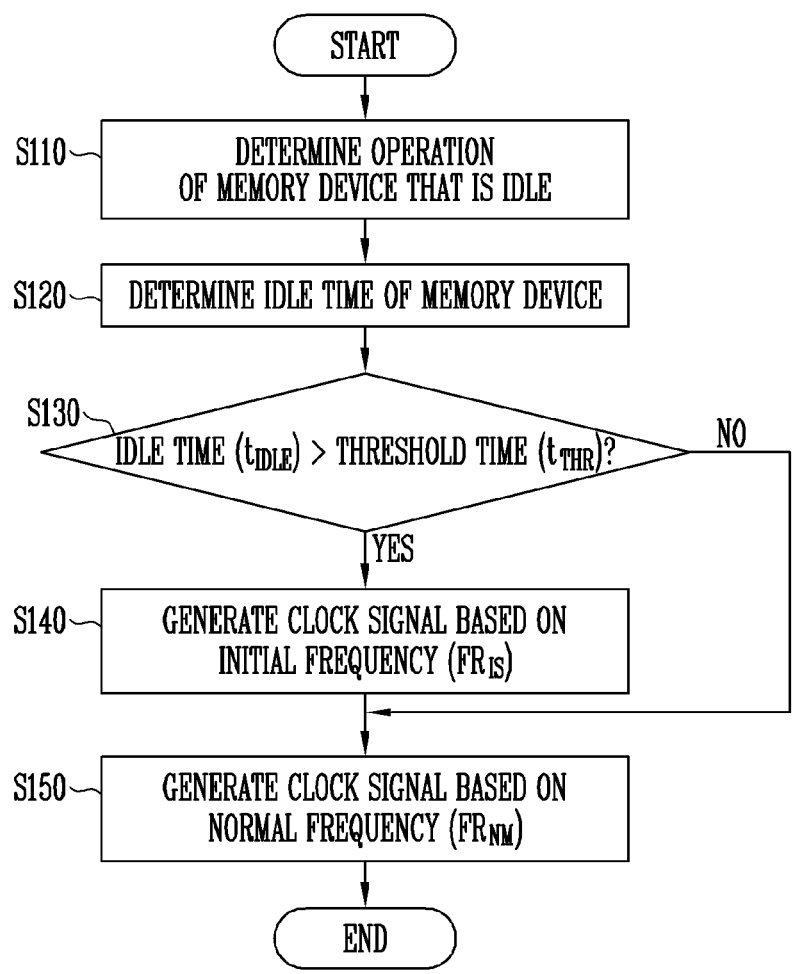
FIG. 13 is a flowchart for describing a method of operating a memory controller in accordance with an embodiment of the present disclosure.

FIG. 13 is a flowchart for describing a method of operating a memory controller (e.g., the memory controller 200 in FIG. 11) in accordance with an embodiment of the present disclosure.

Referring to FIG. 13, at step S110, an operation of a memory device that is idle may be determined. At step S110, it may be determined that an operation of at least one of the first to fourth memory devices 100_1 to 100_4 illustrated in FIG. 8 starts. At step S110, it may be determined that an operation for at least one of the first to eighth memory devices 100_1 to 100_8 illustrated in FIG. 9 starts.

At step S120, an idle time $t_{IDLE}$ of a memory device that has been determined to start the operation may be determined. The idle time $t_{IDLE}$ of the memory device may correspond to a time interval between a first time when a previous operation of the corresponding memory device ends to a second time when a subsequent operation thereof starts. Step S120 may be performed by the idle time monitor 210 of FIG. 11.

At step S130, it is determined whether the determined idle time (or idle time interval) $t_{IDLE}$ is greater than a threshold time (or a threshold time interval) $t_{THR}$. The threshold time $t_{THR}$ may be a value that is determined depending on the design or a result of simulation. If the determined idle time $t_{IDLE}$ is greater than the threshold time $t_{THR}$, it may indicate that the memory device has been idle for a relatively long time. When the memory device that has been idle for a relatively long time starts an operation, there is high possibility for other memory devices to also start operations substantially at the same time.

Therefore, if the idle time $t_{IDLE}$ of the memory device is greater than the threshold time $t_{THR}$ (YES at step S130), a clock signal needed for the operation may be generated based on an initial frequency $FR_{IS}$ (at step S140). Hence, during an initial operation period of the memory device, the clock signal may be generated based on the initial frequency $FR_{IS}$. For example, the generated clock signal may have the initial frequency $FR_{IS}$ during the initial operation period. After the initial operation period of the memory device, a clock signal may be generated based on a normal frequency $FR_{NM}$ (at step S150). Hence, during a normal operation period after the initial operation period of the memory device, the clock signal may be generated based on the normal frequency $FR_{NM}$. For example, the generated clock signal may have the normal frequency $FR_{NM}$ during a normal operation period. The initial frequency $FR_{IS}$ may be a value less than the normal frequency $FR_{NM}$. Therefore, if the idle time $t_{IDLE}$ of the memory device is greater than the threshold time $t_{THR}$ (YES at step S130), the initial operation may be performed based on the initial frequency $FR_{IS}$ having a value less than the normal frequency $FR_{NM}$, and the normal operation may be thereafter performed based on the normal frequency $FR_{NM}$. The operation frequency of the memory device may have great influence on current consumption. Hence, the peak current $I_{PK}$ that occurs in a transient period t0 to t2 of FIG. 10 may be reduced.

If the determined idle time $t_{IDLE}$ is equal to or less than the threshold time $t_{THR}$, it may indicate that the memory device has been idle for a relatively short time. If the memory device that has been idle for a relatively short time starts an operation, there is high possibility for other memory devices each to keep performing current operations or remain in the idle state, rather than starting a new operation. Therefore, if the idle time $t_{IDLE}$ of the memory device is equal to or less than the threshold time $t_{THR}$ (NO at step S130), the process may directly enter the normal operation period without the initial operation period. Therefore, in this case, step S150 may be directly performed without performing step S140. Hence, the operating speed of the memory device may not be significantly reduced because of an unnecessary initial operation.

Figure 14A:
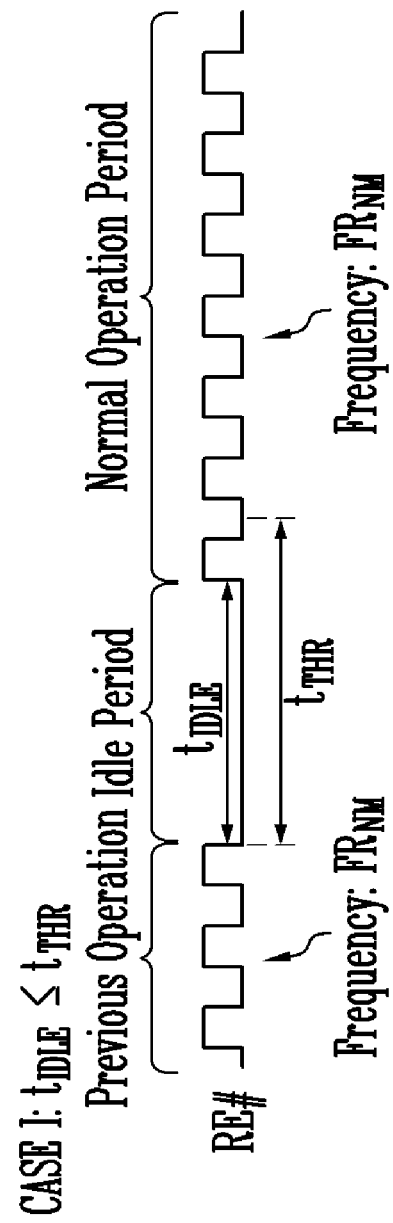

FIGS. 14A and 14B are timing diagrams for describing a method of operating a memory controller (e.g., the memory controller 200 in FIG. 11) in accordance with an embodiment of the present disclosure. Although FIGS. 14A and 14B illustrate read enable signals RE # as examples of a clock signal, embodiments of the present disclosure are not limited thereto. For example, a data strobe signal DQS which is generated by the memory controller 200 may also be illustrated in the same manner as illustrated in FIGS. 14A and 14B.

FIG. 14A shows a read enable signal RE # that is generated in a first case CASE I where the idle time $t_{IDLE}$ is equal to or less than the threshold time $t_{THR}$ as a result of the determination at step S130 of FIG. 13. The read enable signal RE # that has swung based on the normal frequency $FR_{NM}$ during a previous operation period may not swing during an idle period. Since the idle time $t_{IDLE}$ in the idle period is less than the threshold time $t_{THR}$, the idle period may end and a normal operation period may directly start. Specifically, the idle time $t_{IDLE}$ may correspond to a duration of the idle period. During the normal operation period, the read enable signal RE # may be generated based on the normal frequency $FR_{NM}$ at step S150 of FIG. 13. During the normal operation period, a data transfer operation may be performed between a memory device and a memory controller. In more detail, since a clock signal illustrated in FIG. 14A is a read enable signal RE #, read data may be transmitted from the memory device to the memory controller during the normal operation period.

FIG. 14B shows a read enable signal RE # that is generated in a second CASE II where the idle time $t_{IDLE}$ is greater than the threshold time $t_{THR}$ as a result of the determination at step S130. The read enable signal RE # that has swung based on the normal frequency $FR_{NM}$ during a previous operation period may not swing during an idle period. Since the idle time $t_{IDLE}$ in the idle period is greater than the threshold time $t_{THR}$, the idle period may end and an initial operation period, i.e., an initial frequency scaling period, may start. During the initial frequency scaling period, the read enable signal RE # may be generated based on a scaled initial frequency $FR_{IS}$ at step S140 of FIG. 13. The initial frequency $FR_{IS}$ may have a value less than the normal frequency $FR_{NM}$. Hence, during the initial frequency scaling period, a clock signal, e.g., a read enable signal RE #, may swing at a relatively low speed.

If the initial operation period, i.e., the initial frequency scaling period, is terminated, the normal operation period may start. During the normal operation period, the read enable signal RE # may be generated based on the normal frequency $FR_{NM}$ at step S150. During the initial frequency scaling period and the normal operation period, a data transfer operation may be performed between the memory device and the memory controller. In more detail, since a clock signal illustrated in FIG. 14B is a read enable signal RE #, read data may be transmitted from the memory device to the memory controller during the initial frequency scaling period and the normal operation period.

As illustrated in FIGS. 14A and 14B, when the memory device 100 starts an operation, the memory controller 200 in accordance with an embodiment of the present disclosure may control the initial frequency of a clock signal output based on the idle time $t_{IDLE}$ of the memory device 100. In the memory controller 200 in accordance with an embodiment of the present disclosure, if the idle time $t_{IDLE}$ of the memory device 100 exceeds the threshold time $t_{THR}$, a clock signal to be output to the memory device 100 may be generated based on an initial frequency $FR_{IS}$ less than the normal frequency $FR_{NM}$ during the initial frequency scaling period. If the initial frequency scaling period has passed and the process enters a normal operation period, the memory controller may generate a clock signal to be output to the memory devices 100 based on the normal frequency $FR_{NM}$. Therefore, if the plurality of memory devices 100_1 to 100_8 start operations substantially at the same time, the entire current consumption of the storage device 50 may be prevented from rapidly increasing by reducing the initial operation frequency.

Referring to FIG. 14B, the second case CASE II where the initial frequency $FR_{IS}$ used during the initial frequency scaling period is an invariable constant. In other words, during the initial frequency scaling period of FIG. 14B, the frequency of the read enable signal RE # may remain substantially constant. However, various embodiments of the present disclosure are not limited thereto. For example, the initial frequency $FR_{IS}$ that is used during the initial frequency scaling period may vary over time. For instance, the initial frequency $FR_{IS}$ that is used during the initial frequency scaling period may be gradually increased over time. Embodiments of controlling the frequency of a clock signal generated during the initial frequency scaling period will be described with reference to FIGS. 15 to 18.

Figure 15:
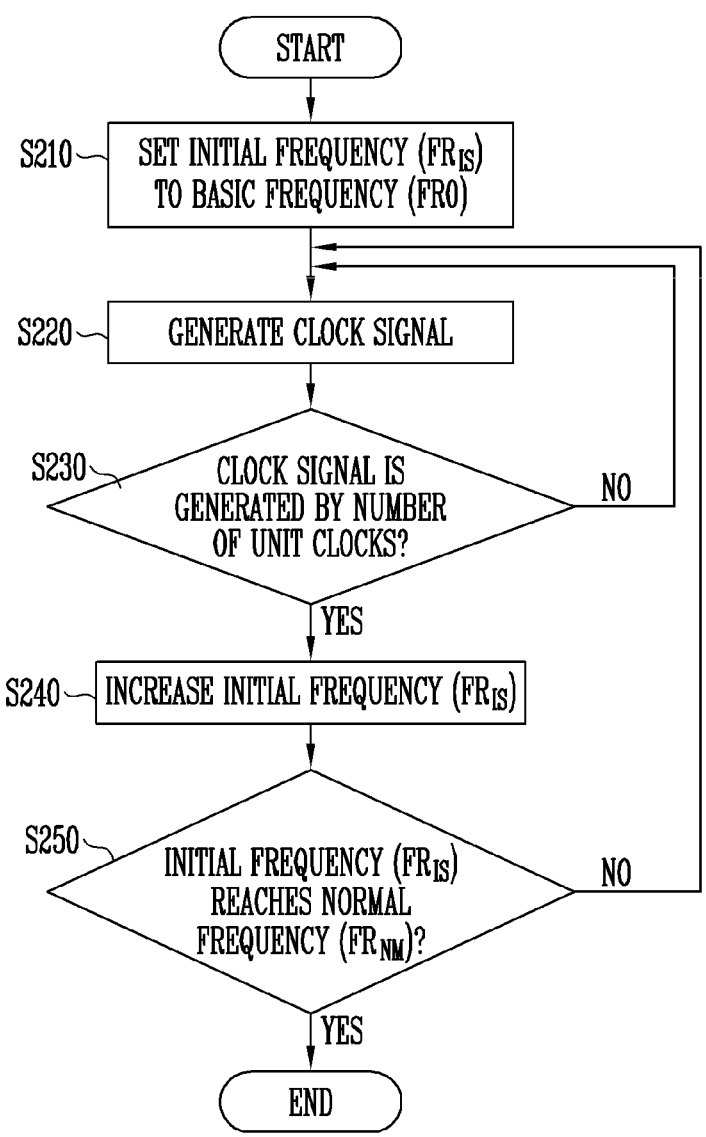
FIG. 15 is a flowchart illustrating step S140 of FIG. 13 in accordance with an embodiment of the present disclosure.

FIG. 15 is a flowchart illustrating step S140 of FIG. 13 in accordance with an embodiment of the present disclosure. FIG. 15 illustrates an example of a method of controlling the frequency of a clock signal generated during an initial frequency scaling period. In other words, FIG. 15 illustrates a method of controlling the initial frequency $FR_{IS}$ according to an embodiment.

Referring to FIG. 15, a frequency controller (e.g., the frequency controller 231 in FIG. 12) may set the initial frequency $FR_{IS}$ to a basic frequency FR0 as an initial value at step S210. The basic frequency FR0 may be a constant value and be less than the normal frequency $FR_{NM}$. Thereafter, at step S220, a clock signal is generated. Step S220 may be performed by a read enable signal generator (e.g., the read enable signal generator 233 in FIG. 12) or a data strobe signal generator (e.g., the data strobe signal generator 235 in FIG. 12). At step S220, a clock signal corresponding to one cycle may be generated. The clock signal may be a read enable signal RE # or a data strobe signal DQS.

After the clock signal corresponding to one cycle has been generated at step S220, it is determined whether clock signals have been generated by a given number of unit clocks at step S230. The number of unit clocks may indicate the number of cycles of clocks that are sequentially generated by the same initial frequency $FR_{IS}$. In an embodiment, the clock signal is generated based on the same initial frequency $FR_{IS}$ until the number of cycles of the generated clock signal reaches a given number. For example, in the case where the number of unit clocks is three, clock signals having the same frequency may be generated during three cycles. The number of unit clocks may be set to various values, as needed.

As a result of the determination at step S230, if clock signals are not generated by the number of unit clocks (NO at step S230), the process may return to step S220 without changing the initial frequency $FR_{IS}$ so that a clock signal corresponding to one cycle is generated again. If the foregoing is repeated and clock signals are thus generated by the number of unit clocks (YES at step S230), the initial frequency $FR_{IS}$ is increased at step S240. At step S240, the initial frequency $FR_{IS}$ may increase by various increments.

After the initial frequency $FR_{IS}$ is increased, it may be determined whether the initial frequency $FR_{IS}$ has reached the normal frequency $FR_{NM}$ at step S250. If the initial frequency $FR_{IS}$ has reached the normal frequency $FR_{NM}$ (YES at step S250), this may indicate that the initial frequency scaling period has been terminated. Therefore, referring back to FIG. 13, step S140 may end, and the process may proceed to step S150 so that the normal operation period may start.

If the initial frequency $FR_{IS}$ has not reached the normal frequency $FR_{NM}$ (NO at step S250), the process may return to step S220 so that a clock signal corresponding to the increased initial frequency $FR_{IS}$ may be generated.

Figure 16A:
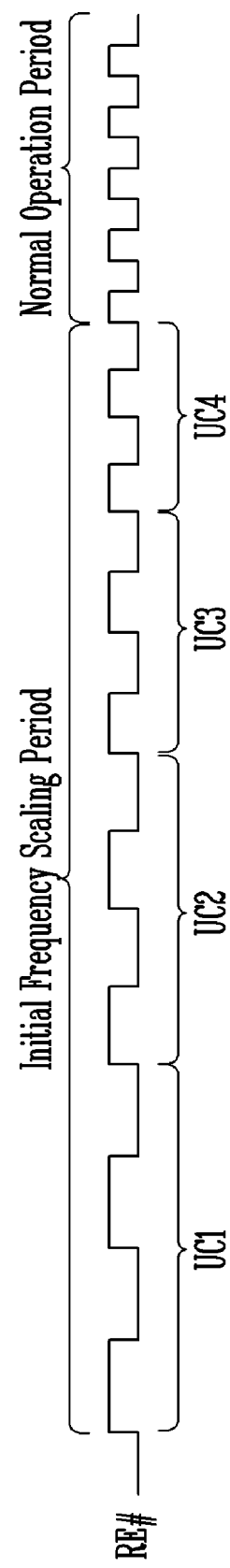
FIGS. 16A and 16B are timing diagrams for describing the embodiment illustrated in FIG. 15.
Figure 16B:
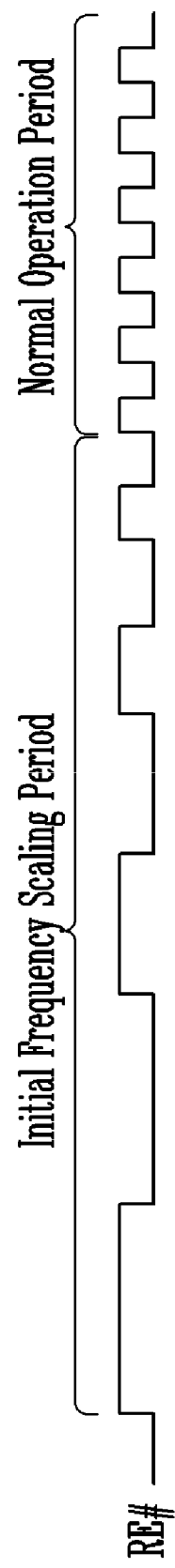

FIGS. 16A and 16B are timing diagrams for describing the process of FIG. 15 according to embodiments.

FIG. 16A illustrates a method of controlling the initial frequency $FR_{IS}$ in the case where the number of unit clocks is two. If the initial frequency scaling period starts, the initial frequency $FR_{IS}$ may be set to the basic frequency FR0, at step S210. Hence, during a first unit clock period UC1, a clock signal (e.g., a read enable signal RE #) corresponding to two cycles may be generated based on the basic frequency FR0.

If the clock signal corresponding to two cycles is generated, the frequency controller 231 may increase the initial frequency $FR_{IS}$ as a result of the determination at step S230.

Hence, during a second unit clock period UC2, a clock signal corresponding to two cycles may be generated based on the increased initial frequency $FR_{IS}$. Likewise, during a third unit clock period UC3, a clock signal may be generated based on a further increased initial frequency $FR_{IS}$. During a fourth unit clock period UC4, a clock signal may be generated based on a further increased initial frequency $FR_{IS}$. In the case where the fourth unit clock period ends and the initial frequency $FR_{IS}$ that has increased by step S240 has reached the normal frequency $FR_{NM}$, the initial frequency scaling period may end and the process may enter the normal operation period.

FIG. 16B illustrates a method of controlling the initial frequency $FR_{IS}$ in the case where the number of unit clocks is one. Since the number of unit clocks is one, the read enable signal RE # may be generated based on the initial frequency $FR_{IS}$ that increases for each period. In other words, since the unit clock period in FIG. 16B is a clock period corresponding to one cycle, the initial frequency $FR_{IS}$ may increase at each time when the clock signal completes one cycle.

Although FIGS. 16A and 16B illustrate examples in which the numbers of unit clocks are two and one, respectively, embodiments of the present disclosure are not limited thereto. For example, an embodiment in which the number of unit clocks is 3 or more may also fall within the bounds of the present disclosure.

FIG. 17 is a flowchart illustrating step S140 of FIG. 13 according to an embodiment. FIG. 17 illustrates an example of a method of controlling a frequency of a clock signal generated during an initial frequency scaling period.

Referring to FIG. 17, a frequency controller (e.g., the frequency controller 231 in FIG. 12) may set the initial frequency $FR_{IS}$ to a basic frequency FR0 as an initial value at step S310. The basic frequency FR0 may be a constant value and be less than the normal frequency $FR_{NM}$. Thereafter, at step S320, a clock signal is generated. Step S320 may be performed by a read enable signal generator (e.g., the read enable signal generator 233 in FIG. 12) or a data strobe signal generator (e.g., the data strobe signal generator 235 in FIG. 12). At step S320, a clock signal corresponding to one cycle may be generated. The clock signal may be a read enable signal RE # or a data strobe signal DQS.

After the clock signal corresponding to one cycle has been generated at step S320, it is determined whether a clock signal has been generated during a unit time (or unit time interval) at step S330. The unit time may indicate the time it takes to generate a clock signal having the same initial frequency $FR_{IS}$. For example, the unit time may be a time interval during which the clock signal is generated to have the same initial frequency $FR_{IS}$ for a given number of periods. The unit time may be set to various values, as needed.

As a result of the determination at step S330, if a duration during which the clock signal has been generated is shorter than the unit time (NO at step S330), the process may return to step S320 without changing the initial frequency $FR_{IS}$ so that a clock signal corresponding to one cycle is generated again. For example, when the duration during which the clock signal has been generated is shorter than the unit time, the process continues to generate the clock signal during a next cycle while keeping the initial frequency $FR_{IS}$. The foregoing is repeated, and a clock signal is generated based on the same initial frequency $FR_{IS}$ until it reaches the unit time. For example, the process continues to generate the clock signal having the same initial frequency $FR_{IS}$ until the duration during which the clock signal has been generated reaches the unit time.

If a clock signal is generated during the unit time (YES at step S330), the initial frequency value $FR_{IS}$ is increased, at step S340. At step S340, the initial frequency FSIS may increase by various increments.

After the initial frequency $FR_{IS}$ has increased, it is determined whether an initial operation time has passed at step S350. The initial operation time may be a predetermined fixed time and be used to determine the initial frequency scaling period. If the initial operation time has passed (YES at step S350), this may indicate that the initial frequency scaling period has ended. Therefore, referring back to FIG. 13, step S140 may end, and the process may proceed to step S150 so that the normal operation period may start.

If the initial operation time has not yet passed (NO at step S350), the process may return to step S320 so that a clock signal corresponding to the increased initial frequency $FR_{IS}$ is generated.

Figure 18:
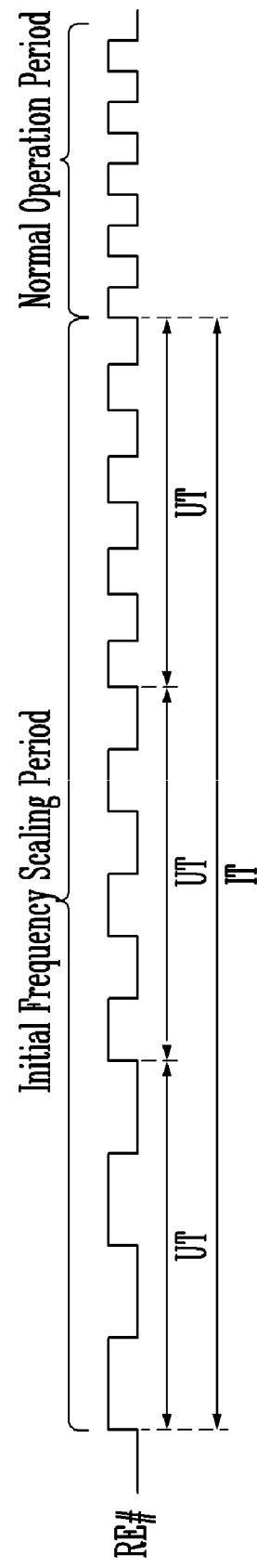
FIG. 18 is a timing diagram for describing the embodiment illustrated in FIG. 17.

FIG. 18 is a timing diagram for describing the process in FIG. 17 according to an embodiment.

Referring to FIG. 18, there are illustrated a unit time UT and an initial operation time IT. During the unit time UT, the initial operation frequency $FR_{IS}$ may remain substantially constant. Each time the unit time UT passes, the initial operation frequency $FR_{IS}$ is increased. If the initial operation time IT passes, the initial frequency scaling period ends, and the normal operation period starts.

Although FIGS. 15 to 18 illustrate embodiments of step S140 of generating a clock signal based on the initial frequency $FR_{IS}$, embodiments of the present disclosure are not limited thereto. Therefore, during the initial frequency scaling period, the initial frequency $FR_{IS}$ may be controlled not only by the methods described in the embodiments of FIGS. 15 to 18 but also by various methods. As described with reference to FIGS. 15 to 18, the initial frequency $FR_{IS}$ may be controlled such that it is gradually increased during the initial frequency scaling period. Referring back to FIG. 16A, the read enable signal RE # has a first initial frequency during the first unit clock period UC1, a second initial frequency during the second unit clock period UC2, a third initial frequency during the third unit clock period UC3, and a fourth initial frequency during the fourth unit clock period UC4. In an embodiment, the second initial frequency is a first given times as great as the first initial frequency, the third initial frequency is a second given times as great as the second initial frequency, and the fourth initial frequency is a third given times as great as the third initial frequency. For example, each of the first, second, and third given times may be in a range from 1.1 times to 5 times. The initial frequency $FR_{IS}$ that is controlled during the initial frequency scaling period may have a value that is always less than the normal frequency $FR_{NM}$.

Figure 19:
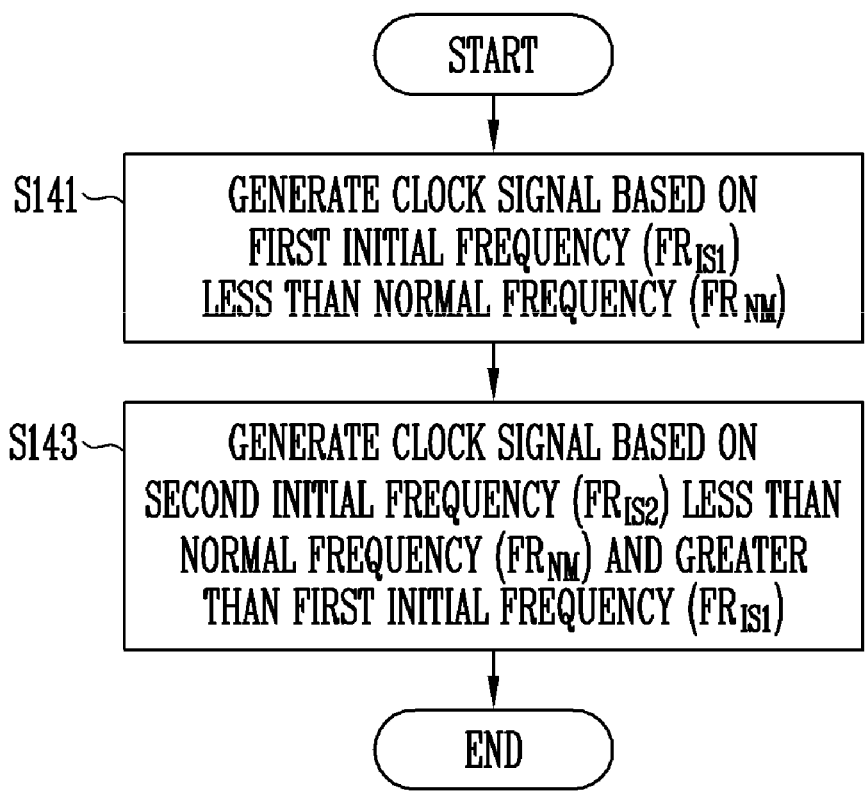
FIG. 19 is a flowchart illustrating step S140 of FIG. 13 in accordance with an embodiment of the present disclosure.

FIG. 19 is a flowchart illustrating step S140 of FIG. 13 according to an embodiment.

Referring to FIG. 19, step S140 of generating a clock signal needed to perform an operation based on the initial frequency $FR_{IS}$ illustrated in FIG. 13 may include step S141 of generating a clock signal based on a first initial frequency $FR_{IS}$ less than the normal frequency $FR_{NM}$, and the step S143 of generating a clock signal based on a second initial frequency $FR_{IS2}$ less than the normal frequency $FR_{NM}$ and greater than the first initial frequency $FR_{IS1}$.

Referring to FIGS. 14B, 16A, 16B, and 18, the initial frequency scaling period may be set to a single period. However, in a method of operating the memory controller in accordance with an embodiment of the present disclosure, the initial frequency scaling period may include two or more periods. Hereinafter, the embodiment of FIG. 19 will be described with reference to FIG. 20 together.

Figure 20:
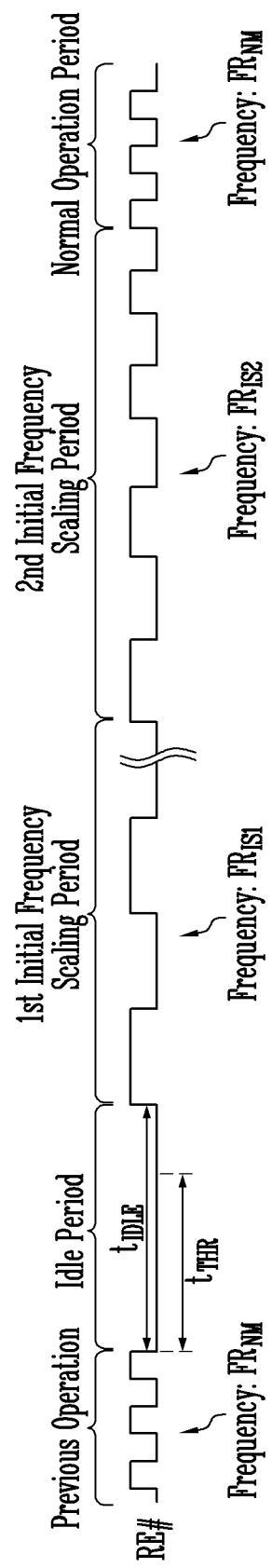
FIG. 20 is a timing diagram for describing the embodiment illustrated in FIG. 19.

FIG. 20 is a timing diagram for describing the process illustrated in FIG. 19 according to an embodiment.

FIG. 20 shows a read enable signal RE # that is generated in the case where the idle time $t_{IDLE}$ is greater than the threshold time $t_{THR}$ as a result of the determination at step S130 of FIG. 13. The read enable signal RE # that has swung based on the normal frequency $FR_{NM}$ during a previous operation period may not swing during an idle period. Since the idle time $t_{IDLE}$ in the idle period is greater than the threshold time $t_{THR}$, the idle period ends and an initial operation period, i.e., an initial frequency scaling period, starts. During an initial frequency scaling period including a first initial frequency scaling period and a second initial frequency scaling period, the read enable signal RE # may be generated based on scaled first and second initial frequencies $FR_{IS1}$ and $FR_{IS2}$ at step S140 of FIG. 13. During the first initial frequency scaling period, the second initial frequency scaling period, and a normal operation period, a data transfer operation may be performed between a memory device and a memory controller. In more detail, since a clock signal illustrated in FIG. 20 is a read enable signal RE #, read data may be transmitted from the memory device to the memory controller during the first initial frequency scaling period, the second initial frequency scaling period, and the normal operation period.

In an embodiment illustrated in FIG. 20, the initial frequency scaling period may include a first initial frequency scaling period and a second initial frequency scaling period. During the first initial frequency scaling period, a read enable signal RE # may be generated based on the first initial frequency $FR_{IS1}$ at step S141. The first initial frequency $FR_{IS1}$ may be a value less than the normal frequency $FR_{NM}$. During the second initial frequency scaling period, a read enable signal RE # may be generated based on the second initial frequency $FR_{IS2}$ at step S143. The second initial frequency $FR_{IS2}$ may have a value less than the normal frequency $FR_{NM}$ and greater than the first initial frequency $FR_{IS1}$.

In an embodiment, the first initial frequency $FR_{IS1}$ may have a constant value. In this case, during the first initial frequency scaling period, the read enable signal RE # may be generated based on a constant frequency less than the normal frequency $FR_{NM}$. However, embodiments of the present disclosure are not limited thereto. For example, the first initial frequency $FR_{IS1}$ may have a value that is gradually increased during the first initial frequency scaling period.

In an embodiment, the second initial frequency $FR_{IS2}$ may have a value that is gradually increased during the second initial frequency scaling period. In this case, the read enable signal RE # based on the second initial frequency $FR_{IS2}$ may be generated in the same manner as described with reference to FIGS. 15 to 18. However, embodiments of the present disclosure are not limited thereto. For example, the second initial frequency $FR_{IS2}$ may have a constant value during the second initial frequency scaling period.

If the initial operation period including the first and second initial frequency scaling periods is terminated, the normal operation period may start. During the normal operation period, the read enable signal RE # may be generated based on the normal frequency $FR_{NM}$ at step S150 of FIG. 13.

As illustrated in FIGS. 19 and 20, when the memory device 100 starts an operation, the memory controller 200 in accordance with an embodiment of the present disclosure may control the initial frequency of a clock signal output based on the idle time $t_{IDLE}$ of the memory device 100. In the memory controller 200 in accordance with an embodiment of the present disclosure, if the idle time $t_{IDLE}$ of the memory device 100 exceeds the threshold time $t_{THR}$, a clock signal to be output to the memory device 100 may be generated based on the first and second initial frequencies $FR_{IS1}$ and $FR_{IS2}$ that are less than the normal frequency $FR_{NM}$ during the first and second initial frequency scaling periods. If the initial frequency scaling period has passed and the process enters a normal operation period, the memory controller 200 may generate a clock signal to be output to the memory devices 100 based on the normal frequency $FR_{NM}$. Therefore, if the plurality of memory devices 100_1 to 100_8 start operations substantially at the same time, the entire current consumption of the storage device 50 may be prevented from rapidly increasing by reducing the initial operation frequency.

Figure 21:
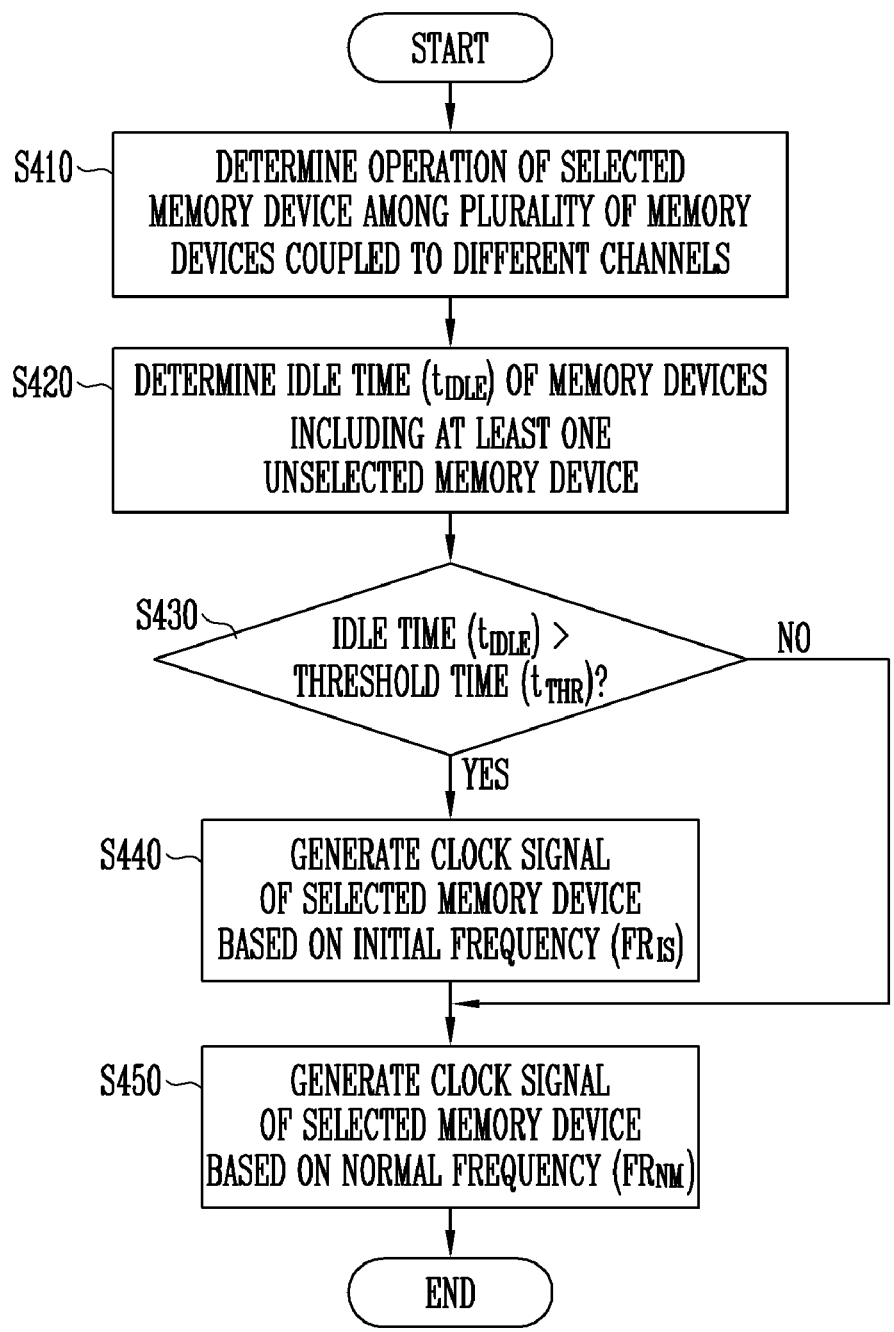
FIG. 21 is a flowchart illustrating a method of operating a memory controller in accordance with an embodiment of the present disclosure.
Figure 22:
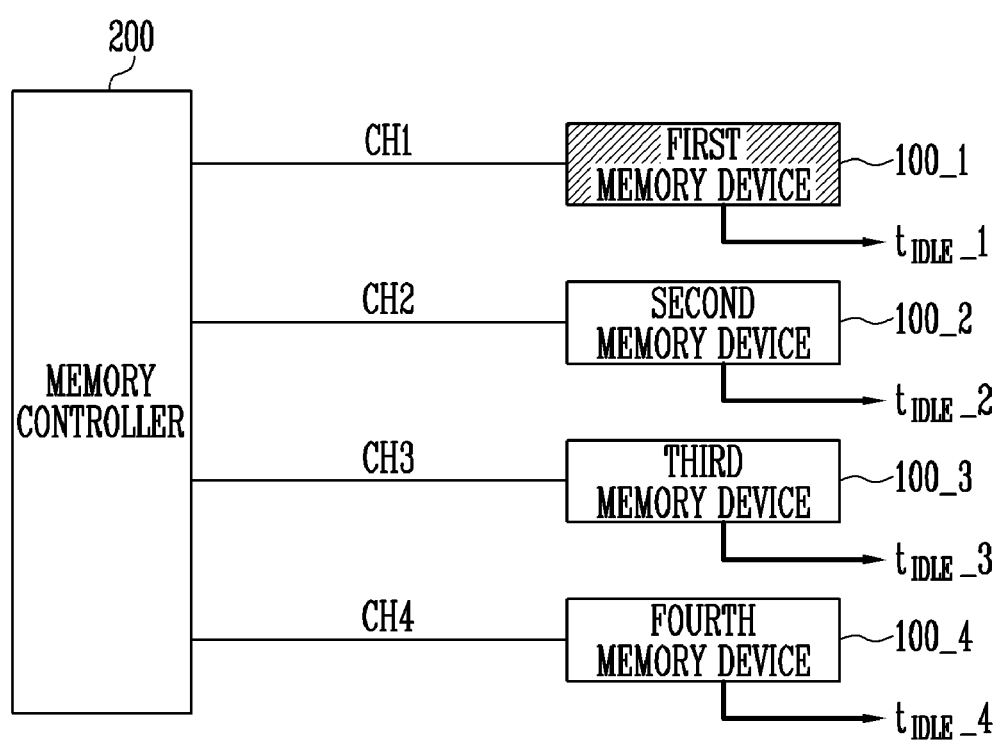
FIG. 22 is a diagram for describing a method of determining an idle time according to steps S410 and S420 of FIG. 21 in accordance with an embodiment of the present disclosure.

FIG. 21 is a flowchart illustrating a method of operating a memory controller in accordance with an embodiment of the present disclosure. FIG. 22 is a diagram for describing a method of determining an idle time at steps S410 and S420 of FIG. 21 according to an embodiment. Referring to FIGS. 21 and 22 together, a frequency scaling operation may be performed based on an idle time of one or more memory devices other than a memory device that starts an operation. Hereinafter, description will be made with reference to FIGS. 21 and 22 together.

Referring to FIGS. 21 and 22, at step S410, an operation of a memory device selected from among a plurality of memory devices 100_1 to 100_4 coupled to respective different channels CH1 to CH4 may be determined. Here, the selected memory device may be idle. Referring to FIG. 22, there is illustrated an example in which, at step S410, the first memory device 100_1 of the first to fourth memory devices 100_1 to 100_4 is the selected memory device. In FIG. 22, idle times of the first to fourth memory devices 100_1 to 100_4 are illustrated as being respectively first to fourth idle times $t_{IDLE\_1}$ to $t_{IDLE\_4}$. According to the embodiment illustrated in FIGS. 13 to 14B, the idle time $t_{IDLE}$ at step S120 of FIG. 13 may be determined to be the first idle time $t_{IDLE\_1}$ of the first memory device 100_1 that is the selected memory device. According to the embodiment of FIGS. 21 and 22, the idle time $t_{IDLE}$ may be determined based on an idle time of the unselected memory devices rather than the selected memory device. Since the selected memory device 100_1 has been idle, the first idle time $t_{IDLE\_1}$ may have a value other than 0. If any one memory device of the second to fourth memory devices 100_2 to 100_4 is in operation, the idle time of the operating memory device may be determined to be 0.

At step S420, an idle time (or an idle time interval) $t_{IDLE}$ of memory devices including at least one unselected memory device among the plurality of memory devices may be determined. The unselected memory device may be a memory device other than the selected memory device. In FIG. 22, the at least one unselected memory device may include second to fourth memory devices 100_2 to 100_4. At step S420, an idle time $t_{IDLE}$ of memory devices including at least one memory device among the second to fourth memory devices 100_2 to 100_4 may be determined.

In an embodiment, the idle time $t_{IDLE}$ at step S420 may be determined to be any one idle time among the second to fourth idle times $t_{IDLE\_2}$ to $t_{IDLE\_4}$.

In an embodiment, the idle time $t_{IDLE}$ at step S420 may be determined to be the sum of two idle times among the first to fourth idle times $t_{IDLE\_1}$ to $t_{IDLE\_4}$.

In an embodiment, the idle time $t_{IDLE}$ at step S420 may be determined to be the sum of three idle times among the first to fourth idle times $t_{IDLE\_1}$ to $t_{IDLE\_4}$.

In an embodiment, the idle time $t_{IDLE}$ at step S420 may be determined to be the sum of all of the first to fourth idle times $t_{IDLE\_1}$ to $t_{IDLE\_4}$.

Figure 23:
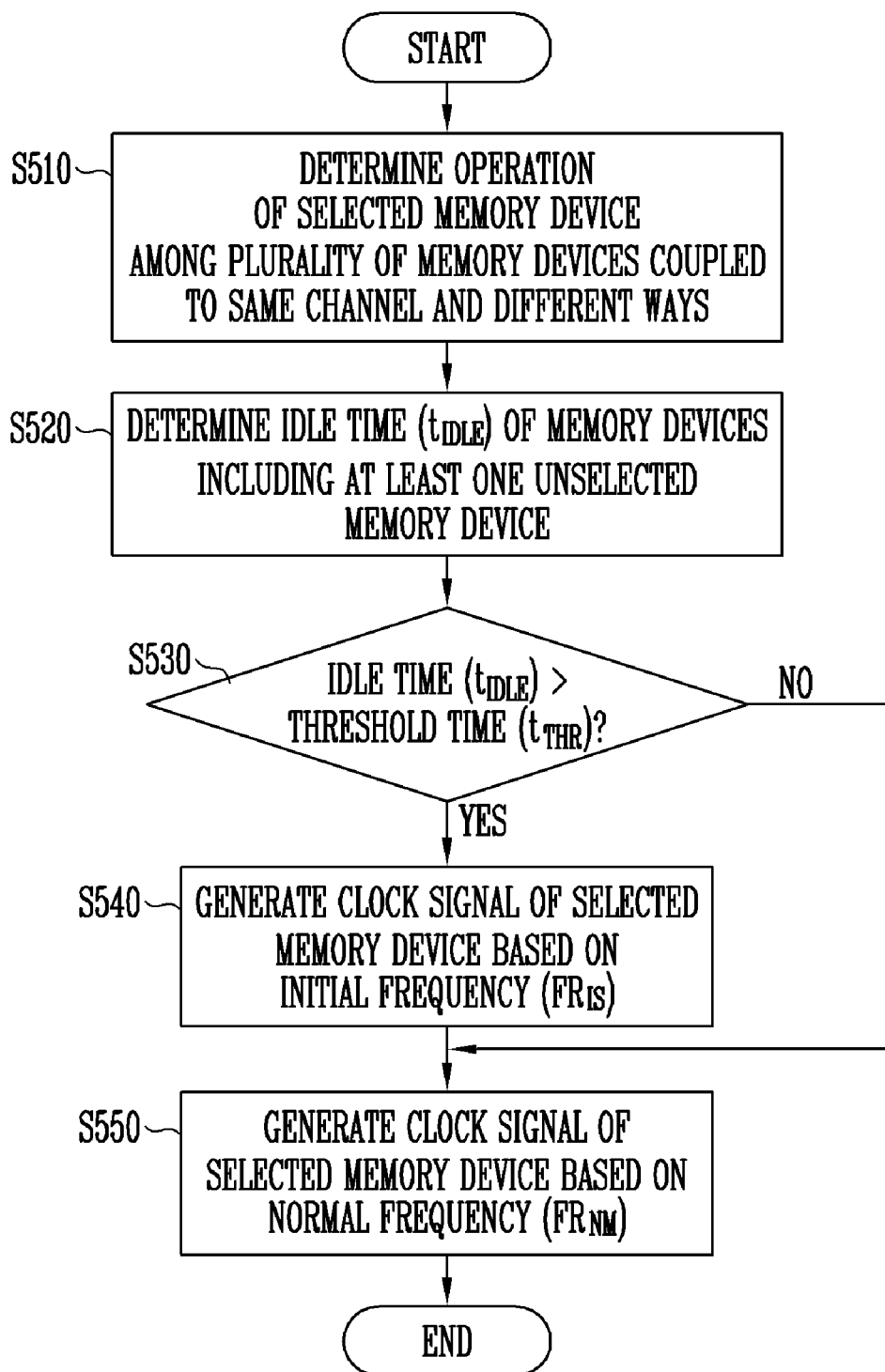
FIG. 23 is a flowchart illustrating a method of operating the memory controller in accordance with an embodiment of the present disclosure.
Figure 24:
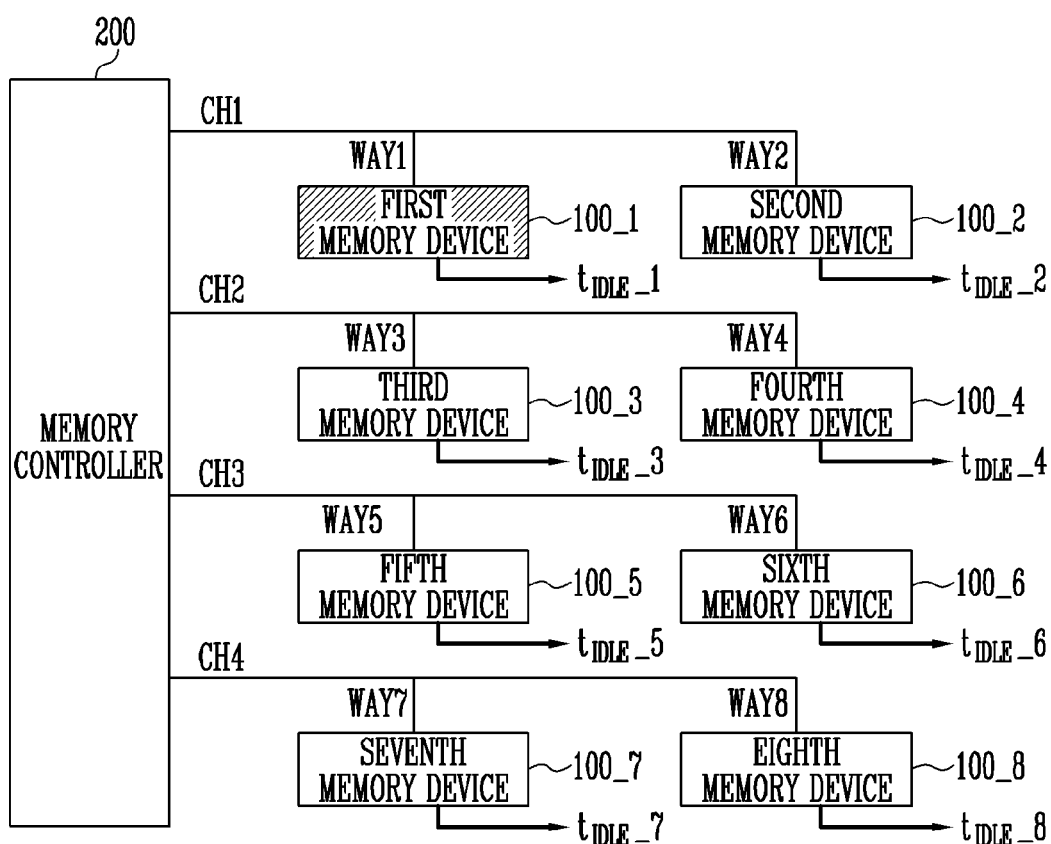
FIG. 24 is a diagram for describing a method of determining an idle time according to steps S510 and S520 of FIG. 23 in accordance with an embodiment of the present disclosure.

FIG. 23 is a flowchart illustrating a method of operating a memory controller in accordance with an embodiment of the present disclosure. FIG. 24 is a diagram for describing a method of determining an idle time at steps S510 and S520 of FIG. 23 according to an embodiment. Referring to FIGS. 23 and 24 together, a frequency scaling operation may be performed based on an idle time of memory devices other than a memory device that starts an operation. Hereinafter, description will be made with reference to FIGS. 23 and 24 together. FIG. 24 shows an example where two memory devices are coupled to each channel. In other embodiments, three or more memory devices may be coupled to each channel. In the embodiment shown in FIG. 24, the first memory device 100_1 is coupled to the first channel CH1 through a first way WAY1 and the second memory device 100_2 is coupled to the first channel CH1 through a second way WAY2. The first and second memory devices 100_1 and 100_2 may be coupled to the memory controller 200 through the first channel CH1. The third memory device 100_2 is coupled to the second channel CH2 through a third way WAY3, and the fourth memory device 100_4 is coupled to the second channel CH2 through a fourth way WAY4. Hence, the third and fourth memory devices 100_3 and 100_4 may be coupled to the memory controller 200 through the second channel CH2.

Referring to FIGS. 23 and 24, at step S510, an operation of a memory device selected from among the plurality of memory devices 100_1 to 100_8 coupled to the plurality of channels CH1 to CH4 and the respective different ways WAY1 to WAY8 may be determined. Here, the selected memory device may be idle. Referring to FIG. 24, there is illustrated an example in which, at step S510, the first memory device 100_1 of the first to eighth memory devices 100_1 to 100_8 is the selected memory device. In FIG. 24, idle times of the first to eighth memory devices 100_1 to 100_8 are illustrated as being respectively first to eighth idle times $t_{IDLE\_1}$ to $t_{IDLE\_8}$. According to the embodiment illustrated in FIGS. 13 to 14B, the idle time $t_{IDLE}$ at step S120 of FIG. 13 may be determined to be the first idle time $t_{IDLE\_1}$ of the first memory device 100_1 that is the selected memory device. According to the embodiment of FIGS. 23 and 24, the idle time $t_{IDLE}$ may be determined based on an idle time of an unselected memory device that is coupled to the same channel as that of the selected memory device and coupled to a way different from that of the selected memory device. Since the selected memory device 100_1 has been idle, the first idle time $t_{IDLE\_1}$ may have a value other than 0. If any one memory device of the second to eighth memory devices 100_2 to 100_8 is in operation, the idle time of the operating memory device may be determined to be 0.

At step S520, an idle time $t_{IDLE}$ of memory devices including at least one unselected memory device among the plurality of memory devices may be determined. In this case, the idle time $t_{IDLE}$ of memory devices including the unselected memory device that is coupled to the same channel as that of the selected memory device and to a way different from that of the selected memory device may be determined. In FIG. 24, the unselected memory device that is coupled to the same channel CH1 as that of the first memory device 100_1 and to a way WAY2 different from that WAY1 of the first memory device 100_1 may be the second memory device 100_2. At step S520, the idle time $t_{IDLE}$ of the memory devices including the second memory device 100_2 may be determined.

In an embodiment, the idle time $t_{IDLE}$ at step S520 may be determined to be the second idle time $t_{IDLE\_2}$.

In an embodiment, the idle time $t_{IDLE}$ at step S520 may be determined to be the sum of the first idle time $t_{IDLE\_1}$ and the second idle time $t_{IDLE\_2}$. In an embodiment, the idle time $t_{IDLE}$ at step S520 may be determined to be the sum of the second idle time $t_{IDLE\_2}$ and any one of the third to eighth idle times $t_{IDLE\_3}$ to $t_{IDLE\_8}$.

In an embodiment, the idle time $t_{IDLE}$ at step S520 may be determined to be the sum of the second idle time $t_{IDLE\_2}$ and any two of the first and the third to eighth idle times $t_{IDLE\_1}$ and $t_{IDLE\_3}$ to $t_{IDLE\_8}$.

In an embodiment, the idle time $t_{IDLE}$ at step S520 may be determined to be the sum of the second idle time $t_{IDLE\_2}$ and any three of the first and the third to eighth idle times $t_{IDLE\_1}$ and $t_{IDLE\_3}$ to $t_{IDLE\_8}$.

In an embodiment, the idle time $t_{IDLE}$ at step S520 may be determined to be the sum of the second idle time $t_{IDLE\_2}$ and any four of the first and the third to eighth idle times $t_{IDLE\_1}$ and $t_{IDLE\_3}$ to $t_{IDLE\_8}$.

In an embodiment, the idle time $t_{IDLE}$ at step S520 may be determined to be the sum of the second idle time $t_{IDLE\_2}$ and any five of the first and the third to eighth idle times $t_{IDLE\_1}$ and $t_{IDLE\_3}$ to $t_{IDLE\_8}$.

In an embodiment, the idle time $t_{IDLE}$ at step S520 may be determined to be the sum of the second idle time $t_{IDLE\_2}$ and any six of the first and the third to eighth idle times $t_{IDLE\_1}$ and $t_{IDLE\_3}$ to $t_{IDLE\_8}$.

In an embodiment, the idle time $t_{IDLE}$ at step S520 may be determined to be the sum of all of the first to eighth idle times $t_{IDLE\_1}$ to $t_{IDLE\_8}$.

Figure 25:
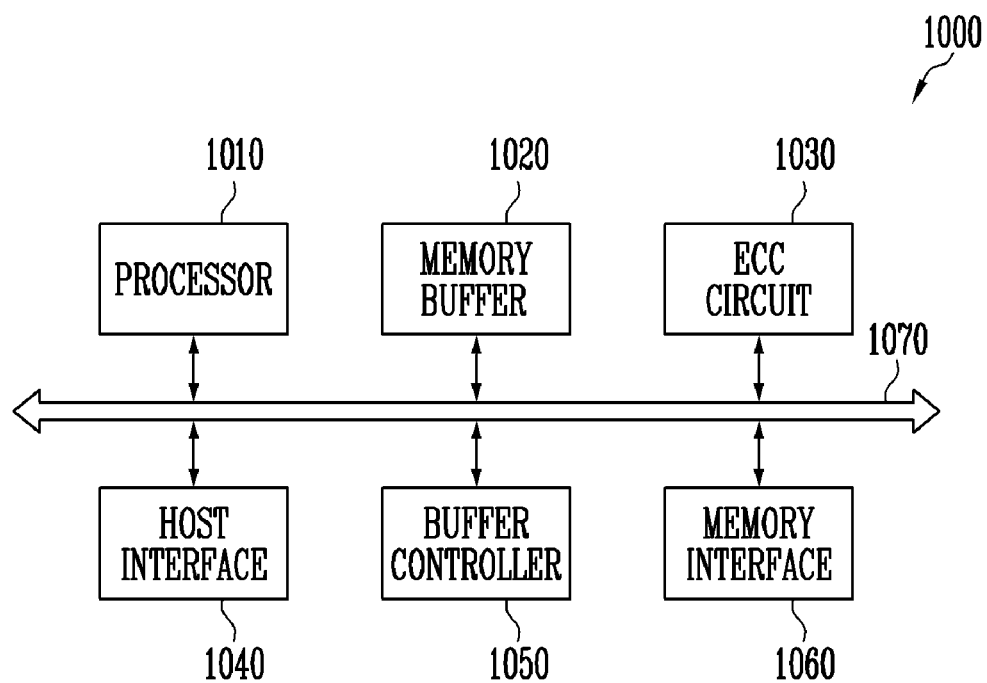
FIG. 25 is a diagram illustrating an example of the memory controller of FIG. 1.

FIG. 25 is a diagram illustrating an example of the memory controller 200 of FIG. 1.

A memory controller 1000 is coupled to a host and a memory device. In response to a request from the host, the memory controller 1000 may access the memory device. For example, the memory controller 1000 may control a write operation, a read operation, an erase operation, and a background operation of the memory device.

The memory controller 1000 may provide an interface between the memory device and the host. The memory controller 1000 may drive firmware for controlling the memory device.

Referring to FIG. 25, the memory controller 1000 may include a processor 1010, a memory buffer 1020, an error correction code (ECC) circuit 1030, a host Interface 1040, a buffer controller 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040 and communicate with the memory device through the memory interface 1060. In addition, the processor 1010 may communicate with the memory buffer 1020 through the buffer controller 1050. The processor 1010 may control the operation of the storage device by using the memory buffer 1020 as an operating memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA and translate the LBA into the PBA using a mapping table. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device as data to be stored, and may be programmed to the memory cell array.

The processor 1010 may drive software or firmware to perform the randomizing operation or the derandomizing operation.

The memory buffer 1020 may be used as a working memory, a cache memory, or a buffer memory of the processor 1010. The memory buffer 1020 may store codes and commands to be executed by the processor 1010. The memory buffer 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device through the memory interface 1060. ECC encoded data may be transmitted to the memory device through the memory interface 1060. The ECC circuit 1030 may perform an ECC decoding operation on data received from the memory device through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multi-media card (MMC), an embedded MMC (eMMC), a dual in-line memory module (DIMM), a registered DIMM (RDIMM), and a load reduced DIMM (LRDIMM) communication methods.

The buffer controller 1050 may control the memory buffer 1020 under control of the processor 1010.

The memory interface 1060 may communicate with the memory device under control of the processor 1010. The memory interface 1060 may communicate a command, an address, and data with the memory device through the channel. When the memory device included in the storage device (50 of FIG. 1) starts an operation, the processor 1010 may control an initial operation frequency based on the idle time of the corresponding memory device. In an embodiment, the processor 1010 may monitor the idle time of the memory device included in the storage device (50 of FIG. 1) and update the monitored idle time to the memory buffer 1020. When the memory device that has been idle starts the operation, the processor 1010 may determine the initial operation frequency based on the idle time stored in the memory buffer 1020. The memory interface 1060 may generate a clock signal to be transmitted to the memory device, based on the initial operation frequency determined by the processor 1010.

Therefore, the idle time monitor 210 of FIG. 11 may be implemented as the processor 1010 and the memory buffer 1020 of FIG. 25. The clock signal generator 230 of FIG. 11 may be implemented as the memory interface 1060 of FIG. 25.

For example, the processor 1010 may control the operation of the memory controller 1000 by using codes. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer controller 1050, the ECC circuit 1030, and the memory interface 1060. The control bus may be coupled to the host interface 1040, the processor 1010, the buffer controller 1050, the memory buffer 1020, and the memory interface 1060.

Figure 26:
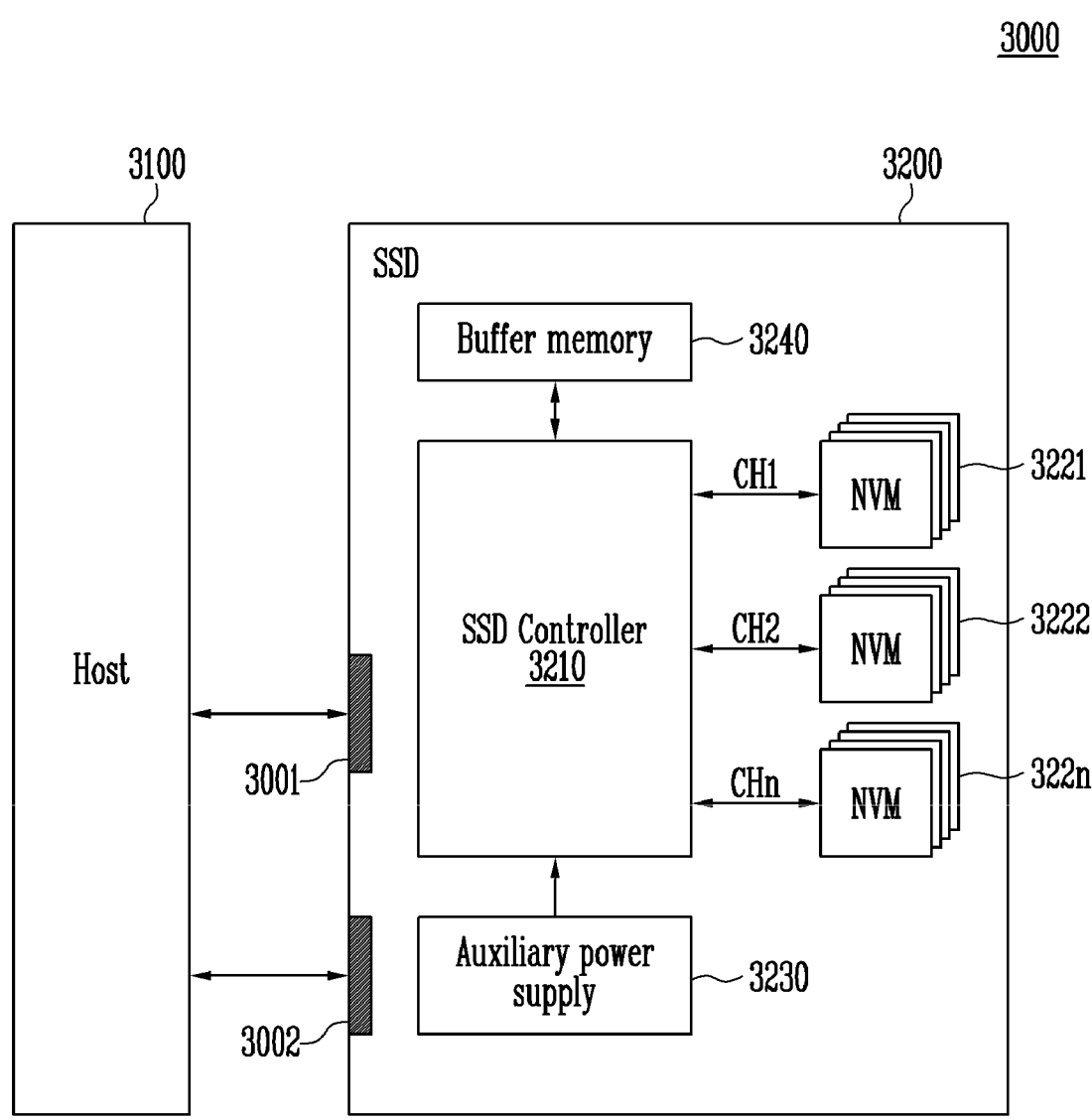
FIG. 26 is a block diagram illustrating a solid state drive (SSD) system to which the storage device in accordance with an embodiment of the present disclosure is applied.

FIG. 26 is a block diagram illustrating a solid state drive (SSD) system 3000 to which the storage device in accordance with an embodiment of the present disclosure is applied.

Referring to FIG. 26, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller (200 of FIG. 1), described above with reference to FIG. 1.

The SSD controller 3210 may control the plurality of flash memories 3221 to 322n in response to the signals SIG received from the host 3100. In an embodiment, the signals SIG may be signals based on an interface between the host 3100 and the SSD 3200. For example, the signals SIG may be signals defined by at least one of various interfaces such as universal serial bus (USB), multi-media card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe) interfaces.

In an embodiment, when any one of the plurality of flash memories 3221 to 322n starts an operation, the SSD controller 3210 may control an initial frequency of an output clock signal based on an idle time $t_{IDLE}$ of the corresponding flash memory. In the case where the idle time $t_{IDLE}$ of the corresponding flash memory exceeds the threshold time $t_{THR}$, the SSD controller 3210 may generate a clock signal based on an initial frequency $FR_{IS}$ less than the normal frequency $FR_{NM}$ during an initial frequency scaling period. If the initial frequency scaling period has passed and the process enters a normal operation period, the SSD controller 3210 may generate a clock signal to be output to the corresponding flash memory based on the normal frequency $FR_{NM}$. Therefore, if the plurality of memory devices 3221 to 322n start operations at the same time, the entire current consumption of the SSD system 3000 may be prevented from rapidly increasing by reducing the initial operation frequency.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., a mapping table) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 27:
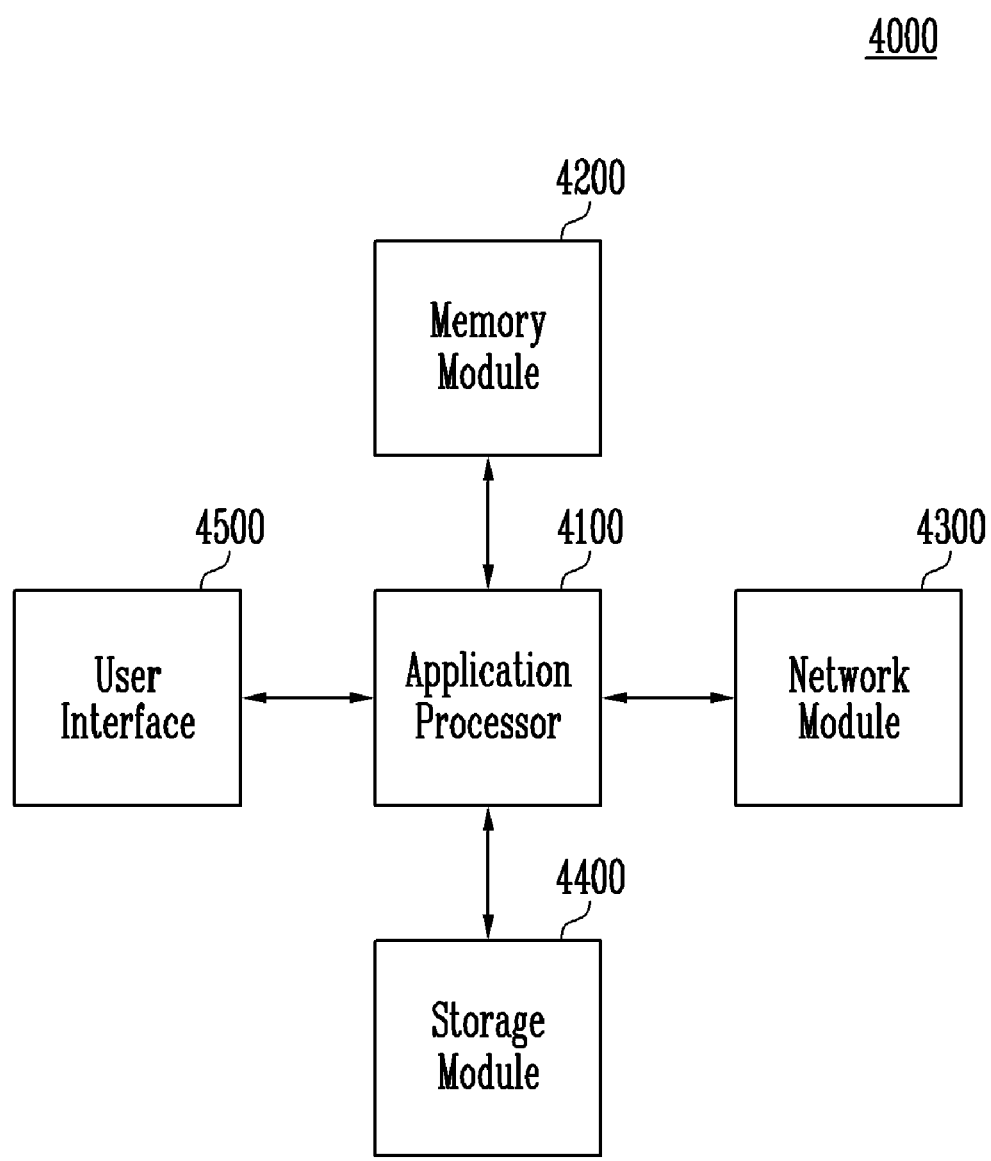
FIG. 27 is a block diagram illustrating a user system to which the storage device in accordance with an embodiment of the present disclosure is applied.

FIG. 27 is a block diagram illustrating a user system 4000 to which the storage device in accordance with an embodiment of the present disclosure is applied.

Referring to FIG. 27, the user system 4000 may include an application processor 4100, a memory module 4200, a network module 4300, a storage module 4400, and a user interface 4500.

The application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

In an embodiment, when any one of a plurality of memory devices included in the storage module 4400 starts an operation, the application processor 4100 may control an initial frequency of a clock signal to be output to a channel the application processor 4100 and the corresponding memory device, based on an idle time $t_{IDLE}$ of the corresponding memory device. In the case where the idle time $t_{IDLE}$ of the corresponding memory device exceeds the threshold time $t_{THR}$, the application processor 4100 may output a generated clock signal to the channel between the application processor 4100 and the corresponding memory device, based on an initial frequency $FR_{IS}$ less than the normal frequency $FR_{NM}$ during an initial frequency scaling period. If the initial frequency scaling period has passed and the process enters a normal operation period, the application processor 4100 may output a generated clock signal to the channel between the application processor 4100 and the corresponding memory device based on the normal frequency $FR_{NM}$. Therefore, if the plurality of memory devices included in the storage module 4400 start operations at the same time, the entire current consumption of the user system 4000 may be prevented from rapidly increasing by reducing the initial operation frequency.

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or WI-FI communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, and each of the plurality of nonvolatile memory devices may be operated in the same manner as that of the memory device described above with reference to FIG. 10. The storage module 4400 may be operated in the same manner as that of the storage device 50 described above with reference to FIG. 1.

The user interface 4500 may include interfaces for inputting data or instructions to the application processor 4100 or outputting data to an external device. In an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as an a Liquid Crystal Display (LCD), an Organic Light Emitting Diode (OLED) display device, an Active Matrix OLED (AMOLED) display device, an LED, a speaker, a monitor, and so on.

Various embodiments of the present disclosure may provide a memory controller capable of sequentially increasing or reducing the total current that is consumed in a plurality of memory devices, and a method of operating the memory controller.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory controller configured to control a memory device, the memory device being coupled to the memory controller through a channel, the memory controller comprising:
   an idle time monitor configured to output an idle time interval of the memory device, the idle time interval being between an end time of a previous operation of the memory device and a start time of a current operation; and
   a clock signal generator configured to generate a clock signal based on the idle time interval and output the clock signal to the memory device through the channel to perform the current operation,
   wherein the clock signal generator determines whether to apply an initial frequency to generate the clock signal during an initial frequency scaling period of the current operation, based on a comparison result of the idle time interval with a threshold time interval.

2. The memory controller according to claim 1, wherein the clock signal generator comprises:
   a frequency controller configured to determine a frequency for generating the clock signal based on the idle time interval; and
   a signal generator configured to generate the clock signal based on the determined frequency.

3. The memory controller according to claim 2, wherein, when the idle time interval is greater than the threshold time interval:
   the frequency controller determines the initial frequency for generating the clock signal during the initial frequency scaling period, and a normal frequency for generating the clock signal during a normal operation period,
   during the initial frequency scaling period, the signal generator generates the clock signal based on the initial frequency; and
   during the normal operation period after the initial frequency scaling period, the signal generator generates the clock signal based on the normal frequency.

4. The memory controller according to claim 3, wherein a value of the initial frequency is less than a value of the normal frequency.

5. The memory controller according to claim 4, wherein the frequency controller gradually increases the initial frequency during the initial frequency scaling period.

6. The memory controller according to claim 4, wherein the initial frequency has a constant value during the initial frequency scaling period.

7. The memory controller according to claim 2, wherein, when the idle time interval is equal to or less than the threshold time interval:
   the frequency controller determines a normal frequency; and
   the signal generator generates the clock signal based on the normal frequency.

8. The memory controller according to claim 2, wherein the signal generator generates a read enable signal or a data strobe signal as the clock signal.

9. The memory controller according to claim 3, wherein the initial frequency scaling period includes a first initial frequency scaling period and a second initial frequency scaling period, wherein the frequency controller determines a first initial frequency for generating the clock signal during the first initial frequency scaling period and a second initial frequency for generating the clock signal during the second initial frequency scaling period, wherein, during the first initial frequency scaling period, the signal generator generates the clock signal based on the first initial frequency, the first initial frequency being less than the normal frequency, and wherein, during the second initial frequency scaling period, the signal generator generates the clock signal based on the second initial frequency, the second initial frequency being less than the normal frequency and greater than the first initial frequency.

10. The memory controller according to claim 9, wherein the first initial frequency has a constant value during the first initial frequency scaling period, and wherein the second initial frequency gradually increases during the second initial frequency scaling period.

11. A storage device comprising:

a plurality of memory devices; and a memory controller coupled with the plurality of memory devices through a plurality of channels and configured to control the plurality of memory devices, wherein, when a single memory device among the plurality of memory devices starts an operation, the memory controller determines whether to apply an initial frequency scaling to a clock signal based on a comparison result of an idle time interval of the memory device with a threshold time interval, and outputs the clock signal to the memory device.

12. The storage device according to claim 11, wherein, when the idle time interval is greater than the threshold time interval, the memory controller generates the clock signal based on a first frequency during an initial operation period, and generates the clock signal based on a second frequency greater than the first frequency during a normal operation period after the initial operation period.

13. The storage device according to claim 12, wherein the first frequency is maintained at a constant value during the initial operation period.

14. The storage device according to claim 12, wherein the first frequency increases during the initial operation period.

15. The storage device according to claim 11, wherein the clock signal is any one of a read enable signal and a data strobe signal.

16. A method of operating a memory controller, the method comprising:

determining to start an operation of a memory device;

determining an idle time interval of the memory device;

determining whether to apply an initial frequency scaling based on a comparison result of the idle time interval with a threshold time interval; and generating a clock signal based on a determination result of whether to apply the initial frequency scaling to output the clock signal to the memory device during the operation of the memory device.

17. The method according to claim 16, wherein determining whether to apply the initial frequency scaling comprises:

determining to apply the initial frequency scaling, when the idle time interval is greater than the threshold time interval, and wherein generating the clock signal based on the determination result of whether to apply the initial frequency scaling comprises:

in response to the comparison result indicating that the idle time interval is greater than the threshold time interval, generating the clock signal based on an initial frequency; and generating the clock signal based on a normal frequency, the normal frequency being greater than the initial frequency.

18. The method according to claim 17, wherein generating the clock signal based on the initial frequency comprises generating the clock signal based on the initial frequency having a constant value.

19. The method according to claim 17, wherein generating the clock signal based on the initial frequency comprises generating the clock signal based on the initial frequency having a value that gradually increases.

20. The memory controller according to claim 1, wherein the initial frequency scaling period starts when the idle time interval ends, the clock signal having the initial frequency during the initial frequency scaling period, the initial frequency being different from a normal frequency of the clock signal.

* * * * *